(12) United States Patent
Sato et al.

(10) Patent No.: US 10,272,710 B2
(45) Date of Patent: Apr. 30, 2019

(54) FLEXOGRAPHIC PRINTING PLATE, FLEXOGRAPHIC PRINTING PLATE PRECURSOR, AND MANUFACTURING METHODS THEREFOR

(71) Applicant: FUJIFILM Corporation, Tokyo (JP)

(72) Inventors: Hiroshi Sato, Shizuoka (JP); Seiichiro Morikawa, Shizuoka (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/010,951

(22) Filed: Jun. 18, 2018

(65) Prior Publication Data

US 2018/0304663 A1   Oct. 25, 2018

Related U.S. Application Data

(63) Continuation of application No. PCT/JP2016/086744, filed on Dec. 9, 2016.

(30) Foreign Application Priority Data

Jan. 4, 2016   (JP) ................................ 2016-000087

(51) Int. Cl.
*B41N 1/12* (2006.01)
*B41C 1/05* (2006.01)
(Continued)

(52) U.S. Cl.
CPC .................. *B41N 1/06* (2013.01); *B41C 1/05* (2013.01); *B41N 1/12* (2013.01); *G03F 7/039* (2013.01); *G03F 7/202* (2013.01)

(58) Field of Classification Search
None
See application file for complete search history.

(56) References Cited

U.S. PATENT DOCUMENTS

| 2005/0199145 A1 | 9/2005 | Morimoto et al. |
| 2012/0240802 A1 | 9/2012 | Landry-Coltrain et al. |

(Continued)

FOREIGN PATENT DOCUMENTS

| JP | 7-228068 A | 8/1995 |
| JP | 2003-043672 A | 2/2003 |

(Continued)

OTHER PUBLICATIONS

International Search Report in application No. PCT/JP2016/086744 dated Feb. 28, 2017.

(Continued)

*Primary Examiner* — Joshua D Zimmerman
(74) *Attorney, Agent, or Firm* — Sughrue Mion, PLLC

(57) ABSTRACT

The present invention is to provide a flexographic printing plate having high ink transferability and making it possible to perform printing with a high ink density in a solid portion, a flexographic printing plate precursor, a method for manufacturing a flexographic printing plate, and a method for manufacturing a flexographic printing plate precursor. A flexographic printing plate includes a relief layer including a non-image area and an image area having an uneven structure formed on a surface thereof, in which an average length RSm of roughness curve elements of the surface of the image area having the uneven structure is 15 to 120 μm, an oil-retention volume A2 is 2 to 180, and a load length ratio Rmr 30% at a cutting level of 30% is 20% to 90%.

20 Claims, 5 Drawing Sheets

(51) Int. Cl.
  *G03F 7/20* (2006.01)
  *B41N 1/06* (2006.01)
  *G03F 7/039* (2006.01)

(56) References Cited

U.S. PATENT DOCUMENTS

2012/0270156 A1    10/2012  Vest et al.
2014/0087139 A1     3/2014  Rowley et al.

FOREIGN PATENT DOCUMENTS

| JP | 2005-335272 A | 12/2005 |
| JP | 2008-68432 A  | 3/2008  |
| JP | 2014-133336 A | 7/2014  |

OTHER PUBLICATIONS

International Preliminary Report on Patentability dated Jul. 10, 2018 issued from the International Bureau in counterpart International Application No. PCT/JP2016/086744.
Written Opinion dated Feb. 28, 2017 from the International Searching Authority in counterpart application No. PCT/JP2016/086744.
Communication dated Nov. 29, 2018, from European Patent Office in counterpart application No. 16883736.7.

FLEXOGRAPHIC PRINTING PLATE, FLEXOGRAPHIC PRINTING PLATE PRECURSOR, AND MANUFACTURING METHODS THEREFOR

CROSS-REFERENCE TO RELATED APPLICATIONS

This application is a Continuation of PCT International Application No. PCT/JP2016/086744 filed on Dec. 9, 2016, which claims priority under 35 U.S.C. § 119(a) to Japanese Patent Application No. 2016-000087 filed on Jan. 4, 2016. The above application is hereby expressly incorporated by reference, in its entirety, into the present application.

BACKGROUND OF THE INVENTION

1. Field of the Invention

The present invention relates to a flexographic printing plate, a flexographic printing plate precursor, a method for manufacturing a flexographic printing plate, and a method for manufacturing a flexographic printing plate precursor.

2. Description of the Related Art

A flexographic printing plate having a flexible relief layer made of resin or rubber has a relatively soft projecting portion (image area) for printing and can conform to various shapes. Therefore, a flexographic printing plate is used for printing performed on objects to be printed made of various materials, thick objects to be printed, and the like.

An image area of a flexographic printing plate is constituted of a solid portion that is printed by filling the portion with ink by fully transferring the ink, and/or halftone dot portions formed of a large number of small projecting dots expressing the gradation of an image printed on an object to be printed by changing the size or density of the small dots. A flexographic printing plate is placed on the peripheral surface of a cylindrical drum, and while a roller is being rotated, the flexographic printing plate is brought into contact with an object to be printed. In this manner, ink is directly transferred to the object to be printed from the surface of a projecting portion (image area) of the printing plate to form an image on the object to be printed.

In such a flexographic printing plate, there is a known problem of the occurrence of printing unevenness since a sufficient amount of ink cannot be transferred to the object to be printed in the solid portion depending on printing conditions such as printing pressure.

In order to solve such a problem, JP1995-228068A (JP-H07-228068A) discloses a printing plate in which a print point to which ink is transferred from a background screen for forming a pattern is covered by a fine screen ([claim 1]), and the surface of the print point of the background screen is enlarged by arranging the fine screen, and therefore a large amount of ink is attached to the screen point of the background screen so that the large amount of ink is transferred to an object to be printed ([0008]).

In addition, JP2003-043672A discloses a flexographic printing plate having a plate surface average roughness of 0.1 to 0.6 μm ([claim 1]), whereby the ink transferability of a solid portion of the flexographic printing plate can be improved ([0006]).

Further, JP2008-068432A discloses a letterpress printing plate precursor formed by adjusting a surface of a print layer (A) by a sandpaper, a polishing film, or a polishing wheel having a polishing agent present on the surface thereof and having a particle size of 3 μm or more and 20 μm or less in which a root mean square surface roughness Rq of the print layer (A) is 0.3 μm or more and 2.4 μm or less, a maximum height Ry of the print layer (A) is 8 μm or more and 21 μm or less, and a ten-point average roughness Rz of the print layer (A) is 8 μm or more and 21 μm or less ([claim 1]), whereby solid quality in letterpress printing such as flexographic printing is improved ([0008]).

SUMMARY OF THE INVENTION

As a result of conducting an investigation on the printing plate disclosed in JP1995-228068A (JP-H07-228068A), the present inventors have found that even in a case where a print point is covered by a fine screen, the ink transferability in a solid portion (particularly, a filled portion of a size of 1 mm square or more) cannot be sufficiently improved and the ink density is lowered.

In addition, as a result of conducting investigations on the printing plates described in JP2003-043672A and JP2008-068432A, it has been found that ink transferability cannot be sufficiently improved and ink density becomes low in the solid portion.

An object of the present invention is to provide a flexographic printing plate having high ink transferability and making it possible to perform printing with a high ink density in a solid portion, a flexographic printing plate precursor, a method for manufacturing a flexographic printing plate, and a method for manufacturing a flexographic printing plate precursor.

As a result of conducting intensive research to achieve the above object, the present inventors have found that by providing a flexographic printing plate having a relief layer including a non-image area and an image area having an uneven structure formed on a surface thereof, in which an average length RSm of roughness curve elements of the surface of the image area having the uneven structure is 15 to 120 μm, an oil-retention volume A2 is 2 to 180, and a load length ratio Rmr 30% at a cutting level of 30% is 20% to 90%, the ink transferability in the solid portion is enhanced, and printing with a high ink density can be performed, and thus have completed the present invention.

That is, the present inventors have found that the above object can be achieved by the following configurations.

[1] A flexographic printing plate comprising: a relief layer including a non-image area and an image area having an uneven structure formed on a surface thereof, in which an average length RSm of roughness curve elements of the surface of the image area having the uneven structure is 15 to 120 μm, an oil-retention volume A2 is 2 to 180, and a load length ratio Rmr 30% at a cutting level of 30% is 20% to 90%.

[2] The flexographic printing plate according to [1], in which the average length RSm of roughness curve elements is 20 to 40 μm.

[3] The flexographic printing plate according to [1] or [2], in which the oil-retention volume A2 is 40 to 140.

[4] The flexographic printing plate according to any one of [1] to [3], in which the load length ratio Rmr 30% is 35% to 75%.

[5] The flexographic printing plate according to any one of [1] to [4], in which the uneven structure includes recessed portions formed of a plurality of grooves and projecting portions other than the recessed portions.

[6] The flexographic printing plate according to any one of [1] to [5], in which a material for forming the relief layer includes a crystalline polymer.

[7] The flexographic printing plate according to [6], in which the crystalline polymer is at least one crystalline polymer selected from the group consisting of a polybutadiene-based thermoplastic elastomer and a polyolefin-based thermoplastic elastomer.

[8] A flexographic printing plate precursor comprising: a relief forming layer having an uneven structure formed on a surface thereof, in which an average length RSm of roughness curve elements of the surface of the relief forming layer having the uneven structure is 15 to 120 μm, an oil-retention volume A2 is 2 to 180, and a load length ratio Rmr 30% at a cutting level of 30% is 20% to 90%.

[9] The flexographic printing plate precursor according to [8], in which the average length RSm of roughness curve elements is 20 to 40 μm.

[10] The flexographic printing plate precursor according to [8] or [9], in which the oil-retention volume A2 is 40 to 140.

[11] The flexographic printing plate precursor according to any one of [8] to [10], in which the load length ratio Rmr 30% is 35% to 75%.

[12] The flexographic printing plate precursor according to any one of [8] to [11], in which the uneven structure includes recessed portions formed of a plurality of grooves and projecting portions other than the recessed portions.

[13] The flexographic printing plate precursor according to any one of [8] to [12], in which a material for forming the relief forming layer includes a crystalline polymer.

[14] The flexographic printing plate precursor according to [13], in which the crystalline polymer is at least one crystalline polymer selected from the group consisting of a polybutadiene-based thermoplastic elastomer and a polyolefin-based thermoplastic elastomer.

[15] A method for manufacturing the flexographic printing plate according to any one of [1] to [7] which has a relief layer including a non-image area and an image area having an uneven structure formed on a surface thereof, the method comprising: a layer forming step of forming a relief forming layer by using a resin composition for laser engraving; and an engraving step of performing laser engraving on the relief forming layer to form the relief layer including the non-image area and the image area having the uneven structure formed on the surface thereof, thereby obtaining the flexographic printing plate.

[16] The method for manufacturing the flexographic printing plate according to [15], further comprising: a crosslinking step of crosslinking the resin composition for laser engraving between the layer forming step and the engraving step.

[17] The method for manufacturing the flexographic printing plate according to [15] or [16], in which the uneven structure is a structure including recessed portions formed of a plurality of grooves and projecting portions other than the recessed portions, and in the engraving step, engraving is performed only in a main scanning direction to form the grooves.

[18] A method for manufacturing the flexographic printing plate according to any one of [1] to [7] which has a relief layer including a non-image area and an image area having an uneven structure formed on a surface thereof, the method comprising: a preparation step of preparing a laminate having a relief forming layer formed of a photosensitive resin composition and an ablation layer in this order; a mask forming step of irradiating the ablation layer with laser and removing a portion of the ablation layer which is irradiated with laser to form a mask having a desired shape; an exposure step of irradiating the relief forming layer with ultraviolet rays through the mask to cure the relief forming layer; and a developing step of removing a portion of the relief forming layer, which is not cured by the exposure step to form the relief layer, thereby obtaining the flexographic printing plate.

[19] A method for manufacturing the flexographic printing plate precursor according to any one of [8] to [14] which has a relief forming layer having an uneven structure formed on a surface thereof, the method comprising: a layer forming step of forming an uncrosslinked relief forming layer by using a resin composition for laser engraving; a crosslinking step of crosslinking the uncrosslinked relief forming layer to form a crosslinked relief forming layer; and an unevenness forming step of, after the crosslinking step, forming the uneven structure on a surface of the crosslinked relief forming layer by transfer to obtain the flexographic printing plate precursor.

[20] A method for manufacturing the flexographic printing plate according to any one of [1] to [7] which has a crosslinked relief layer including a non-image area and an image area having an uneven structure formed on a surface thereof, the method comprising: performing laser engraving on a portion, which becomes the non-image area, of the crosslinked relief forming layer of a flexographic printing plate precursor produced by the method for manufacturing the flexographic printing plate precursor according to [19] to produce the flexographic printing plate having the relief layer including the non-image area and the image area having the uneven structure formed on the surface thereof.

According to the present invention, it is possible to provide a flexographic printing plate having high ink transferability and making it possible to perform printing with a high ink density in a solid portion, a flexographic printing plate precursor, a method for manufacturing a flexographic printing plate, and a method for manufacturing a flexographic printing plate precursor.

DESCRIPTION OF THE PREFERRED EMBODIMENTS

Figure 1:
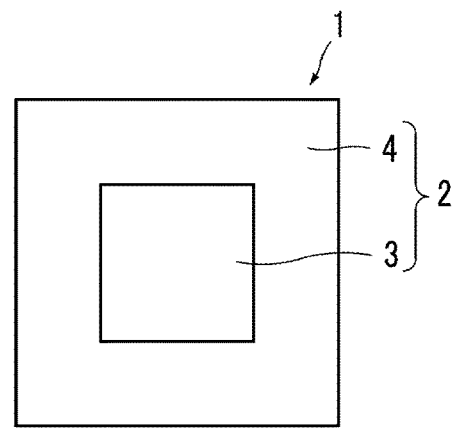
FIG. 1 is a schematic top view showing an example of a flexographic printing plate according to the present invention.

Hereinafter, the present invention will be described in detail.

In the present invention, the notation "lower limit to upper limit", which expresses a numerical range, means "the lower limit or greater and the upper limit or less", and the notation "upper limit to lower limit" means "the upper limit or less and the lower limit or greater". That is, these are numerical ranges that include the upper limit and the lower limit.

In addition, the terms "parts by mass" and "% by mass" have the same meanings as the terms "parts by weight" and "% by weight", respectively.

Herein, regarding the description of a flexographic printing plate and a flexographic printing plate precursor, an uncrosslinked crosslinkable layer is referred to as "uncrosslinked relief forming layer", a layer obtained by crosslinking the uncrosslinked relief forming layer is referred to as "crosslinked relief forming layer", and a layer in which an image area and a non-image area are formed by laser engraving is referred to as "relief layer". In addition, in a case where there is no need to distinguish an uncrosslinked relief forming layer and a crosslinked relief forming layer, the layers are also simply referred to as "relief forming layer".

In addition, the crosslinking is carried out by heat and/or light, and the crosslinking is not particularly limited as long as it is a reaction by which the resin composition is cured.

Further, a printing plate precursor having a crosslinked relief forming layer is laser-engraved and rinsed as desired to produce a flexographic printing plate.

[Flexographic Printing Plate]

A flexographic printing plate of the present invention is a flexographic printing plate having a relief layer including a non-image area and an image area having an uneven structure formed on the surface.

An average length RSm of roughness curve elements of the surface of the image area having the uneven structure is 15 to 120 µm, an oil-retention volume A2 is 2 to 180, and a load length ratio Rmr 30% of a roughness profile at a cutting level of 30% is 20% to 90%.

Here, in the present invention, the uneven structure includes various structures such as a structure including recessed portions formed of a plurality of grooves and projecting portions other than the recessed portions, a structure having a plurality of projecting portions formed of fine columnar or hemispherical protrusion portions or the like, a structure having a plurality of recessed portions formed of columnar or hemispherical fine holes or the like, and a structure whose surface is roughened.

In addition, the average length RSm of roughness curve elements of the surface is a parameter defined in "Geometrical Product Specifications (GPS)-Surface texture: Profile method-Terms, definitions and surface texture parameters" of JIS B 0601:2001, and is a parameter indicating the average pitch of the uneven structure in the plane direction. This parameter represents the average of lengths Xs of profile elements at the sampling length and is a parameter in a horizontal direction.

In the present specification, first, the surface of the image area having the uneven structure is subjected to confocal measurement by using a hybrid laser microscope OPTELICS (registered trademark) HYBRID (manufactured by Lasertec Corporation) and an objective lens 50×Apo (high numerical aperture (high NA)) at a height interval of 0.1 µm to obtain three-dimensional data. Next, using dedicated analysis software LMeye7, the measurement data is analyzed and the average length RSm of roughness curve elements is obtained. Evaluation is performed such that while setting a region of vertical 300 µm and horizontal 300 µm as an evaluation range, the lengths for 1,024 lines in the horizontal direction are measured to obtain an average value of respective evaluation values.

In addition, the oil-retention volume A2 is a parameter defined in "Geometrical Product Specifications (GPS)-Surface texture: Profile method; Surfaces having stratified functional properties—" of JIS B 0671-2:2002, corresponds to the area of a projecting valley portion in a load curve, and is a parameter indicating variation in valley depth. This parameter is a parameter associated with both vertical and horizontal directions (the parameter of the load curve).

In the present specification, first, the surface of the image area having the uneven structure is subjected to confocal measurement by using a hybrid laser microscope OPTELICS (registered trademark) HYBRID (manufactured by Lasertec Corporation) and an objective lens 50×Apo (high NA) at a height interval of 0.1 µm to obtain three-dimensional data. Next, using dedicated analysis software LMeye7, the measurement data is analyzed to obtain an oil-retention volume A2. The measurement data is analyzed by, first, obtaining a load curve indicating that as the depth becomes deeper, the material portion increases in a roughness profile and obtaining an equivalent straight line equivalent to the center portion of the load curve. Next, a straight line is drawn from a point intersecting the equivalent straight line and the vertical axis at a position of Mr=100% on the horizontal axis to be parallel to the horizontal axis. The area surrounded by the straight line, the load curve, and the straight line of Mr=100% is obtained as the oil-retention volume A2.

In addition, the load length ratio Rmr 30% of a roughness profile is a parameter defined in "Geometrical Product Specifications (GPS)-Surface texture: Profile method-Terms, definitions and surface texture parameters" of JIS B 0601:2001, represents a ratio of the load length of profile elements with respect to the evaluation length at a cutting level of 30%, and corresponds to an area ratio in a case of slicing the profile elements at 30% height from a profile peak. This parameter is a parameter of the load curve related to both vertical and horizontal directions.

In the following description, the term "load length ratio Rmr 30% of roughness profile" is also simply referred to as "load length ratio Rmr 30%".

In the present specification, first, the surface of the image area having the uneven structure is subjected to confocal measurement by using a hybrid laser microscope OPTEL-ICS (registered trademark) HYBRID (manufactured by Lasertec Corporation) and an objective lens 50×Apo (high NA) at a height interval of 0.1 μm to obtain three-dimensional data. Next, using dedicated analysis software LMeye7, the measurement data is analyzed and the load length ratio Rmr 30% is obtained. Evaluation is performed such that while setting a region of vertical 300 μm and horizontal 300 μm as an evaluation range, the load length ratios for 1,024 lines in the horizontal direction are measured to obtain an average value of respective evaluation values.

According to the flexographic printing plate of the present invention having a configuration in which the average length RSm of roughness curve elements of the surface of the image area having the uneven structure is 15 to 120 μm, the oil-retention volume A2 is 2 to 180, and the load length ratio Rmr 30% at a cutting level of 30% is 20% to 90%, ink transferability in the solid portion is high and printing with a high ink density can be performed.

Although the details are not clear, the present inventors assume as follows.

The present inventors have found that as described in JP1995-228068A (JP-H07-228068A), JP2003-043672A, and JP2008-068432A, only by setting a parameter associated with the height of the surface roughness of the image area to a predetermined range, sufficient ink transferability cannot be always obtained.

The present inventors have thought that this is because of the magnitude of variation in the depth of the recessed portion, and a size of the pitch of the unevenness.

Specifically, in a case where the uneven structure is provided on the surface of the image area, in a portion of the recessed portion having a shallow depth, the flow of ink becomes smooth and ink is easily transferred. However, in a portion of the recessed portion having a deep depth, the flow of ink becomes poor and the ink is not easily transferred. Thus, it is thought that in a case where variation in the depth of the recessed portion is large, a portion in which ink is easily transferred and the portion in which ink is not easily transferred are mixed and as a result, uniformity is deteriorated.

Figure 9:
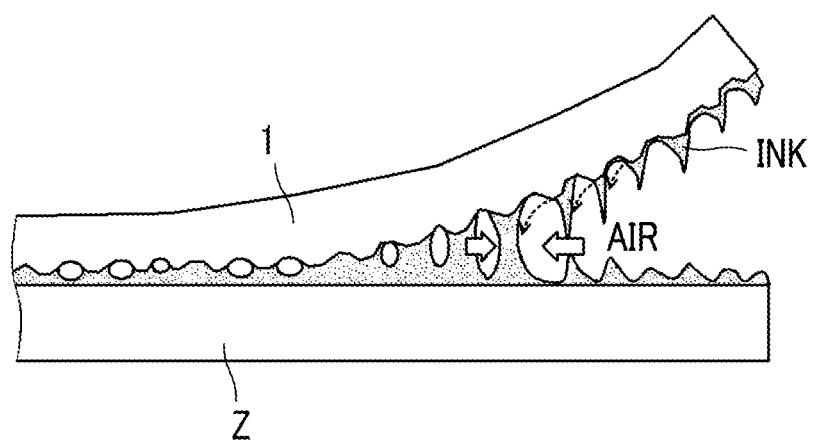
FIG. 9 is a view conceptually showing the flexographic printing plate and an object to be printed during flexographic printing for illustrating the effects of the present invention.

In addition, generally, in a case where air which is a low viscous fluid is pushed into ink which is a highly viscous fluid, a phenomenon that the fluctuation at the interface between the two fluids is generated (destabilized) and the interface grows in a resin form occurs (fingering phenomenon). In a case where the flexographic printing plate is peeled off from an object to be printed, a fingering phenomenon occurs with the air remaining in the recessed portion (valley portion) of the uneven structure of the image area as a starting point and thus the ink is divided (refer to FIG. 9). At this time, in a case where the pitch of the unevenness is large, it is thought that the width of the ink division is widened and as a result, uniformity is deteriorated to generate voids.

The present inventors have thought that in a case where the image area is separated from the object to be printed, it is important to more uniformly transfer ink. For that, the present inventors have conducted intensive research based on the as assumption that it is important to form ink flow paths in consideration of not only a way of thinking where a parameter associated with the height of the surface roughness of the image area are simply controlled, but also a parameter associated with a horizontal direction, a parameter associated with both vertical and horizontal directions, and a parameter associated with a load curve.

As a result, it has been found that by controlling the average length RSm of roughness curve elements which is a parameter associated with a horizontal direction, the oil-retention volume A2 which is a parameter associated with both vertical and horizontal directions, and the load length ratio Rmr 30% which is a parameter associated with a load curve, ink transferability is improved and ink can be uniformly transferred to an object to be printed. Thus, the ink density of the ink to be transferred can be remarkably improved.

It is considered that by setting the average length RSm of roughness curve elements, which is a parameter associated with a horizontal direction, to 120 μm or less, in a case where the flexographic printing plate is peeled off from the object to be printed, the width of the ink division of a fingering phenomenon is reduced and as a result, the uniformity and transferability of the ink to be transferred are improved.

In addition, it is considered that by setting the average length RSm of roughness curve elements to 15 μm or less, the flow of ink becomes smooth and thus the transferability can be improved.

Further, from the viewpoint of the transferability and uniformity of the ink, the average length RSm of roughness curve elements is preferably 15 to 100 μm and more preferably 20 to 40 μm.

It is considered that by setting the oil-retention volume A2, which is a parameter associated with both vertical and horizontal directions, to 180 or less, the variation in the depth of the recessed portion is reduced and as a result, the uniformity and transferability of the ink to be transferred can be improved.

In addition, it is considered that by setting the oil-retention volume A2 to 2 or more, the uneven structure is clearly formed and thus ink flow paths can be formed. As a result, ink transferability can be improved.

Further, from the viewpoint of the transferability and uniformity of ink, the oil-retention volume A2 is preferably 3 to 160 μm and more preferably 40 to 140 μm.

By setting the load length ratio Rmr 30%, which is a parameter of the load curve, to 20% or more, the uneven structure is prevented from being deformed at the printing pressure in a case where the ink is transferred to the object to be printed, the shape of the uneven structure can be maintained. As a result, the transferability and uniformity of the ink to be transferred can be improved by securing ink flow paths.

In addition, it is considered that by setting the load length ratio Rmr 30% to 90% or less, a large number of ink flow paths can be secured and the uniformity and transferability of the ink to be transferred can be improved.

Further, from the viewpoint of the transferability and uniformity of the ink, the load length ratio Rmr 30% is preferably 25% to 85% and more preferably 35% to 75%.

As long as the average length RSm of roughness curve elements, the oil-retention volume A2, and the load length ratio Rmr 30% (hereinafter, also collectively referred to as "surface roughness parameter") can be set to be within the above ranges, various structures such as a structure including recessed portions formed of a plurality of grooves and projecting portions other than the recessed portions, a structure having a plurality of projecting portions formed of fine protrusion portions, a structure having a plurality of recessed portions formed of fine holes, and a structure whose surface is roughened can be used without any limitation in the shape of the uneven structure.

Herein, from the viewpoint of suitably securing ink flow paths, a structure including recessed portions formed of a plurality of grooves and projecting portions other than the recessed portions is preferable.

In a case where the uneven structure is a structure including recessed portions formed of a plurality of grooves and projecting portions other than the recessed portions, since at printing with a higher ink density can be performed by transferring ink without disturbance and mutual interruption of the plurality of grooves, the grooves are preferably arranged to be parallel to each other or in a radial manner and more preferably arranged to be parallel to each other.

Next, the overall configuration of the flexographic printing plate of the present invention will be described using FIGS. 1 to 3.

As shown in FIG. 1, a printing plate 1 as an example of the flexographic printing plate according to the present invention has a relief layer 2 on which an image area 3 and a non-image area 4 are formed.

The image area 3 is a region which is brought into contact with ink at the time of printing to transfer the ink to an object to be printed, that is, a region in which an image is formed at the time of printing. In addition, the non-image area 4 is a region which is not brought into contact with ink at the time of printing, that is, a region in which an image is not formed.

Figure 2:
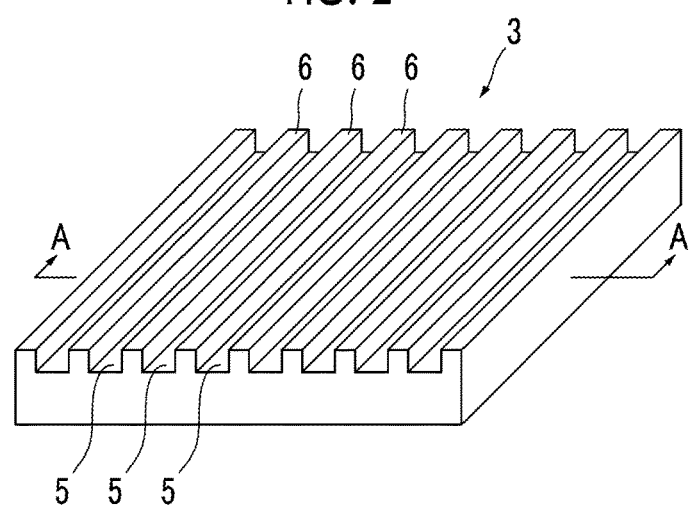
FIG. 2 is a schematic perspective view showing a part of an image area of the flexographic printing plate shown in FIG. 1 in an enlarged manner.
Figure 3:
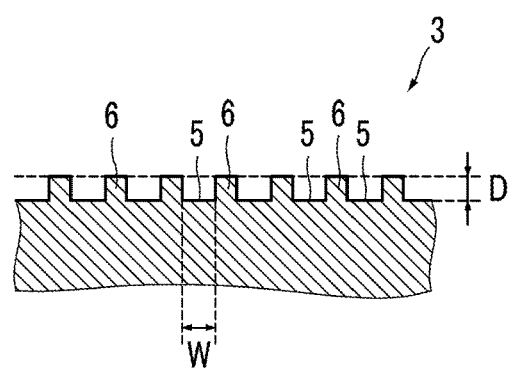
FIG. 3 is a cross-sectional view of the schematic perspective view shown in FIG. 2 taken along line A-A.

In addition, as shown in FIGS. 2 and 3, an uneven structure constituted of recessed portions 5 formed of a plurality of grooves and projecting portions 6 other than the recessed portions 5 is formed on the surface of the image area 3. Reference symbol D shown in FIG. 3 denotes the depth of the recessed portion 5 and reference symbol W denotes the width of the recessed portion 5.

In addition, in the uneven structure including the recessed portions 5 and the projecting portions 6, as long as the average length RSm of roughness curve elements of the surface of the image area is 15 to 120 μm, the oil-retention volume A2 is 2 to 180, and the load length ratio Rmr 30% of a roughness profile at a cutting level of 30% is 20% to 90%, as shown in FIG. 2, each groove may be arranged to be parallel to each other, each groove may be arranged in a radial manner, or each groove may be arranged such that each groove is bent and has two or more linear portions.

Herein, as described above, the uneven structure formed on the surface of the image area includes various structures such as structure including recessed portions formed of a plurality of grooves and projecting portions other than the recessed portions, a structure having a plurality of projecting portions formed of fine columnar or hemispherical protrusion portions or the like, a structure having a plurality of recessed portions formed of columnar or hemispherical fine holes or the like, and a structure whose surface is roughened.

In a case where the uneven structure includes a plurality of grooves, the shape, width, depth, length, and pitch of the grooves are not limited as long as the average length RSm of roughness curve elements is 15 to 120 μm, the oil-retention volume A2 is 2 to 180, and the load length ratio Rmr 30% of a roughness profile at a cutting level 30% is 20% to 90%.

Similarly, in a case where the uneven structure is a structure having a plurality of projecting portions formed of fine protrusion portion, or a structure having a plurality of recessed portions formed of fine holes, the shape, width, height, number density, and arrangement pattern of the protrusion portions, and the shape, width, height, number density, and arrangement pattern of the holes are not limited.

[Flexographic Printing Plate Precursor]

A flexographic printing plate precursor of the present invention is a flexographic printing plate precursor having a crosslinked relief forming layer having an uneven structure formed on a surface thereof.

In addition, the uneven structure includes recessed portions formed of a plurality of grooves, and projecting portions other than the recessed portions.

Further, an average length RSm of roughness curve elements of the surface of the crosslinked relief forming layer having the uneven structure is 15 to 120 μm, an oil-retention volume A2 is 2 to 180, and a load length ratio Rmr 30% of a roughness profile at a cutting level of 30% is 20% to 90%.

The flexographic printing plate precursor of the present invention is the same as the known flexographic printing plate precursor except that the crosslinked relief forming layer has an uneven structure. In addition, the printing plate precursor may have a sheet-like shape or a cylindrical shape.

Herein, as described above, the crosslinked relief forming layer is a layer before laser engraving is performed and is a layer for forming a relief layer having an image area and a non-image area by laser-engraving the crosslinked relief forming layer to remove a region corresponding to the non-image area. Therefore, the surface of the relief forming layer of the printing plate precursor of the present invention becomes the surface of the image area of the above-described flexographic printing plate of the present invention after laser engraving.

That is, the crosslinked relief forming layer of the printing plate precursor of the present invention has an uneven structure which is the same as the uneven structure formed on the surface of the image area of the above-described flexographic printing plate on its surface.

Accordingly, the description of the uneven structure formed on the surface of the crosslinked relief forming layer of the printing plate precursor of the present invention is omitted.

The flexographic printing plate precursor of the present invention may have a support on a rear surface of the crosslinked relief forming layer (the surface on the opposite to the engraved surface).

Although such a support is not particularly limited, a support having high dimensional stability is preferable. Examples thereof include polyester (for example, polyethylene terephthalate (PET), polybutylene terephthalate (PBT), polyethylene naphthalate (PEN)); polyacrylonitrile (PAN); polyimide (PI); polyamide (PA); fluororesin such as Teflon (registered trademark); plastic resin such as silicone resin or polyvinyl chloride; synthetic rubber such as styrene-butadiene rubber; and plastic resin reinforced with glass fibers (such as epoxy resin or phenol resin).

As the support, a PET film, a PEN film, a PI film, a PA film, a fluororesin film, or a silicone resin film is preferably used.

[Method for Manufacturing Flexographic Printing Plate (First Aspect)]

A method for manufacturing a flexographic printing plate according to a first aspect of the present invention (hereinafter, also referred to as "first printing plate manufacturing method") is a method for manufacturing the above-described flexographic printing plate of the present invention, and the method includes a layer forming step of forming a relief forming layer by using a resin composition for laser engraving, and an engraving step of performing laser engraving on the relief forming layer to form the relief layer including a non-image area and the image area having an uneven structure formed on a surface, thereby obtaining the flexographic printing plate.

In addition, it is preferable to provide a crosslinking step of crosslinking the resin composition for laser engraving between the layer forming step and the engraving step.

A method for manufacturing a flexographic printing plate according to a third aspect of the present invention, which will be described later, is a method for manufacturing a flexographic printing plate by using a flexographic printing plate precursor manufactured by a method for manufacturing a flexographic printing plate precursor, which will be described later.

Hereinafter, each step of the first printing plate manufacturing method will be described in detail.

[Layer Forming Step]

The layer forming step is a step of forming a relief forming layer before crosslinking (before curing) by using a resin composition for laser engraving (hereinafter, also simply referred to as "resin composition").

<Resin Composition>

As the resin composition, a known resin composition in the related art for forming a relief forming layer of a flexographic printing plate precursor can be used, and for example, a resin composition containing a binder polymer and a photothermal conversion material may be used.

Hereinafter, each component contained in the resin composition used in the layer forming step will be described in detail.

<Binder Polymer>

The binder polymer is not particularly limited and examples thereof include a thermoplastic polymer and a diene-based polymer.

The thermoplastic polymer is not particularly limited as long as the polymer is a polymer exhibiting thermoplastic properties.

Examples of such a thermoplastic polymer include a polystyrene resin, a polyester resin, a polyamide resin, a polysulfone resin, a polyether sulfone resin, a polyimide resin, a hydroxyethylene unit-containing hydrophilic polymer, an acrylic resin, an acetal resin, an epoxy resin, a polycarbonate resin, a rubber, and a thermoplastic elastomer.

Among these, from the viewpoint of laser engraving sensitivity, a polymer including a partial structure that is thermally decomposed by exposure or heating is preferable. As such a polymer, those described in paragraph [0038] of JP2008-163081A may be preferably used.

In a case where a soft and flexible film formation is desired, a soft resin and a thermoplastic elastomer are preferable. As such resin and polymer, those described in paragraphs [0039] to [0040] of JP2008-163081A may be preferably used.

Further, from the viewpoint of ease of preparation of a resin composition and improvement of resistance to an oil ink in a printing plate to be produced, a hydrophilic or alcohol-compatible polymer is preferably used. As the hydrophilic polymer, those described in paragraph [0041] of JP2008-163081A may be used.

In addition, in a case where the polymer is used to improve strength by being cured by heating or exposure, a polymer having an ethylenically unsaturated bond in the molecule is preferably used.

Such a polymer is a polymer including an ethylenically unsaturated bond in the main chain and examples thereof include polystyrene-polybutadiene (SB), polystyrene-polybutadiene-polystyrene (SBS), polystyrene-polyisoprene-polystyrene (SIS), and polystyrene-polyethylene/polybutylene-polystyrene (SEBS).

A polymer having an ethylenically unsaturated bond in a side chain may be obtained by introducing an ethylenically unsaturated group such as an allyl group, an acryloyl group, a methacryloyl group, a styryl group, or a vinyl ether group into a side chain of the skeleton of a binder polymer which will be described later. As a method for introducing an ethylenically unsaturated group into the side chain of the binder polymer, a known method such as (1) a method in which a polymer is subjected to copolymerization with a constitutional unit having a polymerizable group precursor obtained by bonding a protecting group with a polymerizable group, and the protecting group is eliminated to obtain a polymerizable group or (2) a method in which a polymer compound having a plurality of reactive groups such as hydroxyl groups, amino groups, epoxy groups, or carboxyl groups is produced, and a group that reacts with the above reactive groups and a compound having an ethylenically unsaturated group are subjected to a polymer reaction for introduction may be used. In accordance with these methods, the number of ethylenically unsaturated groups introduced into a polymer compound can be controlled.

The binder polymer is preferably a binder polymer having a reactive functional group such as a hydroxyl group, a silanol group, or a hydrolyzable silyl group, and specific examples thereof include vinyl copolymers (copolymers of vinyl monomers such as polyvinyl alcohol and polyvinyl acetal, and derivatives thereof), and acrylic resins (copolymers of acrylic monomers such as hydroxyethyl(meta)acrylate, and derivatives thereof).

On the other hand, as a diene-based polymer, any known diene-based polymer in the related art can be used without limitations.

Specific examples of the diene-based polymer include polyisoprene, polybutadiene, an ethylene-propylene-diene copolymer (EPDM), an acrylonitrile-butadiene copolymer, a styrene-butadiene copolymer (SBR), a styrene-isoprene copolymer, and a styrene-isoprene-butadiene copolymer, and these may be used singly or in combination of two or more kinds thereof.

Among these diene-based polymers, from the viewpoint of improving film formability of the relief forming layer, a liquid polymer having a melting point of 23° C. or lower (for example, liquid butadiene rubber) can be suitably used.

Here, the melting point is a starting temperature of a heat absorption peak observed in a case where 20 mg of a thermoplastic polymer before heating is placed on a measurement pan for differential scanning calorimetry (DSC) and is heated from 30° C. to 300° C. at 10° C./min in a nitrogen stream.

Among these binder polymers, from the viewpoint of ease of formation of the relief layer and hardness, a crystalline polymer is preferable.

Herein, the term "crystalline polymer" means a polymer in which crystalline regions in which long-chain molecules are regularly arranged and amorphous regions in which long-chain molecules are not regularly arranged are mixed in the molecular structure, and refers to a polymer having a crystallinity of 1 vol % or more, which is the ratio of the crystalline region, at 25 degrees.

In addition, regarding the crystallinity, while the temperature is being changed with a differential scanning calorimeter at a temperature rising rate of 20° C./min in a range of 25° C. to 200° C. in a nitrogen atmosphere, a heat absorption peak (ΔH (J/g)) by crystal melting is obtained. Based on the measured ΔH, a reaching crystallinity (%) is calculated by the following equation.

Crystallinity (%)={ΔH/a}×100

In the equation, "a" denotes a heat of crystal melting in a case where the component of the crystalline region shown in a known document is 100% crystallized (for example, in a case of polylactic acid, 94 J/g, and in a case of polyethylene (HDPE), 293 (J/g)).

Examples of such a crystalline polymer include a polybutadiene-based thermoplastic elastomer, and a polyolefin-based thermoplastic elastomer.

Specific examples thereof include polystyrene-polybutadiene (SB), polystyrene-polybutadiene-polystyrene (SBS), polystyrene-polyisoprene-polystyrene (SIS), polystyrene-polyethylene/polybutylene-polystyrene (SEBS), an acrylonitrile-butadiene-styrene copolymer (ABS), acrylic ester rubber (ACM), an acrylonitrile-chlorinated polyethylene-styrene copolymer (ACS), amorphous polyalphaolefin, atactic polypropylene, an acrylonitrile styrene copolymer, cellulose acetate butyrate, cellulose acetate propionate, an ethylene-vinyl acetate copolymer, ethyl vinyl ether, polyacrylic acid, polypropylene, syndiotactic 1,2-polybutadiene, polyisoprene, polyoctenylene, trans-polyisoprene, polyvinyl butyral, an ethylene-α-olefin copolymer such as an ethylene-octene copolymer, a propylene-α-olefin copolymer, and a 1,3-pentadiene polymer.

Among these, SBS, SIS, SEBS, polypropylene, syndiotactic 1,2-polybutadiene, polyisoprene, polyoctenylene, trans-polyisoprene, an ethylene-α-olefin copolymer such as an ethylene-octene copolymer, and a propylene-α-olefin copolymer are preferable and among these, syndiotactic 1,2-polybutadiene, an ethylene-α-olefin copolymer, a propylene-α-olefin copolymer, and polyoctenylene are particularly preferable.

The content of the liquid crystal polymer in the resin composition is preferably 5% to 90% by mass, more preferably 15% to 85% by mass, and even more preferably 30% to 85% by mass with respect to the total solid content. In the case in which the content of the liquid crystal polymer is in the above range, a relief layer having further excellent rinsability of the engraving residue and excellent ink transferability may be obtained, which is preferable.

<Photothermal Conversion Material>

The photothermal conversion material is considered as a component which accelerates thermal decomposition of a cured product at the time of laser engraving by generating heat through absorption of laser light.

Therefore, it is preferable to select a photothermal conversion material which absorbs the light having a laser wavelength used for engraving.

For example, in a case where laser engraving is performed using laser which emits infrared rays of 700 to 1,300 nm (YAG laser, semiconductor laser, fiber laser, surface emitting laser, or the like) as a light source, for the printing plate precursor of the present invention, as a photothermal conversion material, a compound having a maximum absorption wavelength of 700 to 1,300 nm is preferably used.

As such a photothermal conversion material, various dyes and pigments can be used.

With regard to the photothermal conversion material, examples of dyes that can be used include commercial dyes and known dyes described in publications such as "Senryo Binran" (Dye Handbook) (Ed. by The Society of Synthetic Organic Chemistry, 1970). Specific examples include dyes having a maximum absorption wavelength at 700 to 1,300 nm, and dyes such as azo dyes, metal complex salt azo dyes, pyrazolone azo dyes, naphthoquinone dyes, anthraquinone dyes, phthalocyanine dyes, carbonium dyes, diimmonium compounds, quinone imine dyes, methine dyes, cyanine dyes, squarylium colorants, pyrylium salts, and metal thiolate complexes are preferably used. As the dye that can be preferably used in the present invention, cyanine-based colorants such as heptamethine cyanine colorants, oxonol-based colorants such as pentamethine oxonol colorants, phthalocyanine-based colorants, and dyes described in paragraphs 0124 to 0137 of JP2008-63554A may be used.

Among the photothermal conversion materials used in the present invention, pigments including commercial pigments and pigments described in the Color Index (C.I.) Handbook, "Saishin Ganryo Binran" (Latest Pigments Handbook) (Ed. by Nippon Ganryo Gijutsu Kyokai, 1977), "Saisin Ganryo Ouyogijutsu" (Latest Applications of Pigment Technology) (CMC Publishing, 1986), "Insatsu Inki Gijutsu" (Printing Ink Technology) CMC Publishing, 1984) can be used. Examples of the pigments include pigments described in paragraphs 0122 to 0125 of JP2009-178869A.

Among these pigments, carbon black, which will be described later, is preferable.

(Carbon Black)

The carbon black included is not particularly limited, and as long as dispersibility thereof in the resin composition and the like are stable, any carbon black can be used regardless of the classification by American Society for Testing and Materials (ASTM) and the applications (for example, color applications, rubber applications, and battery applications).

Here, in the present invention, it is considered that carbon black functions as a photothermal conversion agent that accelerates thermal decomposition of a cured product at the time of laser engraving by absorbing laser light and generating heat.

Specific examples of carbon black include furnace black, thermal black, channel black, lamp black, and acetylene black, and these may be used singly or in combination of two or more kinds thereof.

Meanwhile, these carbon blacks can be used as color chips or color pastes, in which carbon blacks have been dispersed in nitrocellulose, a binder or the like in advance using a dispersant as necessary to facilitate dispersion. However, from the viewpoint of cost, it is preferable to use carbon blacks as powders.

In the present invention, the content of carbon black is preferably 1 to 30 parts by mass, more preferably 2 to 25 parts by mass, and particularly preferably 3 to 20 parts by mass with respect to 100 parts by mass of the binder polymer since satisfactory sensitivity is obtained at the time of laser engraving, and satisfactory ink receptivity is obtained.

<Crosslinking Agent>

The resin composition of the present invention may contain a crosslinking agent. In this case, the crosslinking agent is not particularly limited and any polymerization initiator known in the related art (for example, a radical polymerization initiator) or the like can be used.

Specific examples of the polymerization initiator include: (a) an aromatic ketone, (b) an onium salt compound, (c) an organic peroxide, (d) a thio compound, (e) a hexaarylbiimidazole compound, (f) a keto oxime ester compound, (g) a borate compound, (h) an azinium compound, (i) a metallocene compound, (j) an active ester compound, (k) a compound having a carbon-halogen bond, and (l) an azo-based compound, and these may be used singly or in combination of two or more kinds thereof.

Among these, since the half-life temperature is high, and consequently scorching (early curing) at the time of kneading of the resin composition can be suppressed, or since satisfactory engraving sensitivity is obtained, and a satisfactory relief edge shape is obtained in the case in which the resin composition is applied to the relief forming layer of the flexographic printing plate precursor, the (c) organic peroxide is particularly preferable.

Here, regarding the (a) aromatic ketone, (b) onium salt compound, (d) thio compound, (e) hexaarylbiimidazole compound, (f) keto oxime ester compound, (g) borate compound, (h) azinium compound, (i) metallocene compound, (j) active ester compound, (k) compound having a carbon-halogen bond, and (l) azo-based compound, the compounds described in paragraphs "0074" to "0118" of JP2008-63554A can be preferably used.

On the other hand, regarding the (c) organic peroxide mentioned as suitable examples, the compounds described below are preferable.

(Organic Peroxide)

Specific examples of the organic peroxide include dicumyl peroxide (10-hour half-life temperature: 116° C.), α,α'-di(t-butylperoxy)diisopropylbenzene (10-hour half-life temperature: 119° C.), and 2,5-dimethyl-2,5-di(t-butylperoxy)hexane (10-hour half-life temperature: 118° C.), and these may be used singly or in combination of two or more kinds thereof.

In the present invention, regarding the form of the organic peroxide, the organic peroxide can be used as a technical product as it is; however, from the viewpoint of handleability problems (hazardousness, workability, and the like), a dilution product at a concentration of 40 wt % (non-hazardous, powdered) in which a technical product is adsorbed to an inorganic filler such as calcium carbonate, or a master batch type dilution product intended to prevent dusting at the time of kneading and to improve dispersibility in the polymer, can be more preferably used.

Regarding the technical product, for example, PERCUMYL D (manufactured by NOF Corporation), PERKADOX BC-FF (manufactured by Kayaku Akzo Corporation), LUPEROX DC (manufactured by Arkema Yoshitomi, Ltd.), PERBUTYL P (manufactured by NOF Corporation), PERKADOX 14 (manufactured by Kayaku Akzo Corporation), LUPEROX F (manufactured by Arkema Yoshitomi, Ltd.), LUPEROX F90P (manufactured by Arkema Yoshitomi, Ltd.), PERHEXA 25B (manufactured by NOF Corporation), KAYAHEXA AD (manufactured by Kayaku Akzo Corporation), and LUPEROX 101 (manufactured by Arkema Yoshitomi, Ltd.) can be used; however, the examples are not intended to be limited to these.

Furthermore, examples of dilution products include PERCUMYL D-40 (manufactured by NOF Corporation; inert filler dilution product), PERCUMYL D-40 MB (manufactured by NOF Corporation; dilution product of silica/polymer and others), KAYACUMYL D-40C (manufactured by Kayaku Akzo Corporation; calcium carbonate dilution product), KAYACUMYL D-40 MB-S (manufactured by Kayaku Akzo Corporation; rubber master batch), KAYACUMYL D-40 MB (manufactured by Kayaku Akzo Corporation; rubber master batch), PERBUTYL P-40 (manufactured by NOF Corporation; inert filler dilution product), PERBUTYL P-40 MB (manufactured by NOF Corporation; dilution product of silica/polymer and others), PERKADOX 14/40 (manufactured by Kayaku Akzo Corporation; calcium carbonate dilution product), PERKADOX 14-40C (manufactured by Kayaku Akzo Corporation; calcium carbonate dilution product), LUPEROX F40 (manufactured by Arkema Yoshitomi, Ltd.), PERHEXA 25B-40 (manufactured by NOF Corporation; dilution product of silica and others), KAYAHEXA AD-40C (manufactured by Kayaku Akzo Corporation; calcium silicate dilution product), TRIGONOX 101-40 MB (manufactured by Kayaku Akzo Corporation; rubber master batch), and LUPEROX 101XL (manufactured by Arkema Yoshitomi, Ltd.) can be used; however, the examples are not intended to be limited to these.

In the present invention, the amount of the crosslinking agent is preferably 0 to 10 parts by mass, more preferably 0.1 to 7 parts by mass, and even more preferably 0.5 to 5 parts by mass with respect to 100 parts by mass of the binder polymer since excellent rinsability of the engraving residue and satisfactory printing durability and ink receptivity are obtained.

<Optional Additives>

The resin composition may contain optional additives other than the binder polymer and the photothermal conversion material, for example, fillers other than a polymerizable compound and carbon black.

(Polymerizable Compound)

As a polymerizable compound, for example, a compound having an ethylenically unsaturated bond (hereinafter, referred to as "ethylenically unsaturated compound") is preferable.

The ethylenically unsaturated compound may be a monofunctional ethylenically unsaturated compound or a polyfunctional ethylenically unsaturated compound. However, a polyfunctional ethylenically unsaturated compound is preferable. Specifically, as the polyfunctional ethylenically unsaturated compound, a compound having 2 to 20 terminal ethylenically unsaturated groups is preferable. Such compounds are widely known in this industrial field and can be used in the present invention without any particular limitation.

In a case where the resin composition contains the optional polymerizable compounds, the content of the optional polymerizable compounds is preferably 0.1% to 30% by mass and more preferably 1% to 20% by mass with respect to the total mass of the resin composition.

(Other Fillers)

Other fillers may be organic or inorganic. However, since workability is further improved and from the viewpoint of costs and hardness of a cured film, at least one selected from the group consisting of silica, calcium carbonate, mica, talc, and a stearic acid metal salt is preferably used and silica and/or calcium carbonate is particularly preferably used.

(Other Additives)

In the resin composition, various known additives can be appropriately incorporated to the extent that the effects of the present invention are not impaired. Examples thereof include a crosslinking aid, a silane coupling agent, a wax, a process oil, a metal oxide, an ozone decomposition preventing agent, an aging inhibitor, a polymerization inhibitor and a colorant, and these may be used singly or in combination of two or more kinds thereof.

<Formation Method>

Figure 4:
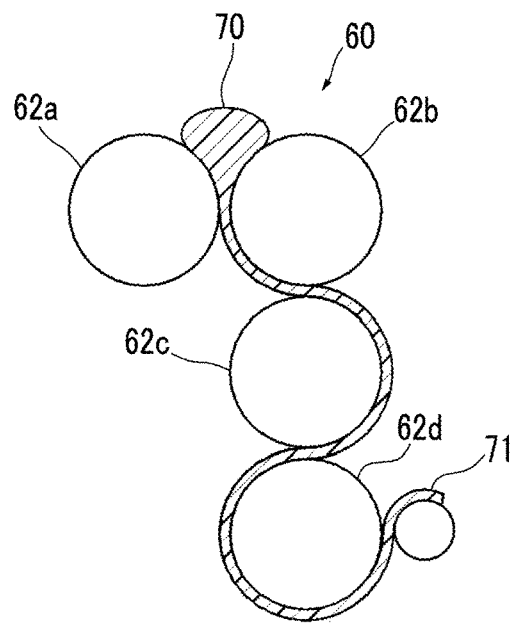
FIG. 4 is a view conceptually showing a calender roll for producing a flexographic printing plate precursor.

As a method for forming the relief forming layer, for example, a method including preparing a resin composition, removing a solvent from the resin composition as required, and then melting and extruding the resin composition on a support; a method including a preparing a resin composition, casting the resin composition on a support, and heating and drying the resin composition in an oven or the like to remove a solvent; a method including molding a resin composition into a sheet shape using a calender roll as shown in FIG. 4, or the like can be suitably used.

In FIG. 4, a calender roll 60 has first roll 62*a* to fourth roll 62*d*, and intervals of these rolls, the temperature of these rolls, and the rotation speed of these rolls can be set.

A sheet-like uncured layer 71, that is, an uncrosslinked relief forming layer can be obtained by setting a kneaded product 70 of the resin composition between the rolls and rolling and molding the material.

[Crosslinking Step]

The crosslinking step is a step of crosslinking the uncrosslinked relief forming layer formed in the above layer forming step to form a crosslinked relief forming layer.

Herein, the crosslinking method is not particularly limited as long as the method is a method for curing the uncrosslinked relief forming layer by light and/or heat. Curing methods used in methods for manufacturing a flexographic printing plate precursor in the related art can be appropriately used.

(Photocuring)

In a case where the uncrosslinked relief forming layer contains a photopolymerization initiator, the relief forming layer can be crosslinked by irradiating the uncrosslinked relief forming layer with light (hereinafter, also referred to as "actinic ray") which becomes a trigger for the photopolymerization initiator.

The irradiation with the actinic ray is generally performed over the entire surface of the uncrosslinked relief forming layer.

Examples of the actinic ray include visible light, ultraviolet light, and an electron beam but ultraviolet light is most generally used. In a case where a base material side for fixing a relief forming layer such as a support of the relief forming layer is taken as a rear surface, only a front surface of the support may be irradiated with light. However, it is preferable to perform irradiation with light from the rear surface as well as from the front surface in a case where the support is a transparent film which transmits an actinic ray. In a case where a protective film is present, the irradiation from the front surface may be performed with the protective film being provided or may be performed after the protective film is removed. Since there is a concern of causing a polymerization inhibition under the presence of oxygen, the irradiation with actinic ray may be performed after coating the relief forming layer with a vinyl chloride sheet under vacuum.

(Thermosetting)

In a case where the uncrosslinked relief forming layer contains a thermal polymerization initiator, the uncrosslinked relief forming layer can be crosslinked by heating.

As heating means for performing crosslinking by heat, a method of heating the uncrosslinked relief forming layer in a hot air oven or a far-infrared oven for a predetermined period of time and a method of bringing a heated roll into contact with an uncrosslinked relief forming layer for a predetermined period of time may be used.

As the method for curing the uncrosslinked relief forming layer, the uncrosslinked relief forming layer is preferably crosslinked by heat from the viewpoint that uniform curing (crosslinking) is possible from the surface to the inside.

In a case where the uncrosslinked relief forming layer is crosslinked by heat, there are advantages in that, first, a relief formed after laser engraving is made sharp and, second, the stickiness of engraving residue generated during the laser engraving is suppressed.

[Engraving Step]

The engraving step is a step of forming a relief layer including a non-image area and an image area having the above-described uneven structure formed on the surface by performing laser engraving on the crosslinked relief forming layer which is crosslinked in the above crosslinking step.

The laser engraving method is not particularly limited. However, in the first printing plate manufacturing method, it is required to perform engraving on a portion which becomes the non-image area (to form the non-image area) and to form the above-described uneven structure on the surface of the image area. Thus, a method of controlling a laser head by a computer based on digital data of a desired image and performing scanning and irradiation on the crosslinked relief forming layer is preferably used.

(Image Data Generation Method)

As the method for generating image data for laser engraving, the following method can be used.

First, original image data of a printing plate to be produced is obtained. Next, in order to convert the original image data into data for performing laser engraving, processing using Raster Image Processor (RIP) is performed. On the other hand, by rasterizing the original image data, a plurality of partial regions having a predetermined width measured from the outer periphery (edge) of each image area is extracted. On each of the extracted partial regions, a template having a predetermined unevenness pattern is superimposed, thereby forming a mask. Further, the image data which had been subjected to RIP processing is multiplied by the generated mask to generate output image data.

In this manner, the output image data is generated by adding the unevenness pattern to the image area of the original image data, and laser engraving is performed using the output image data to produce a flexographic printing plate.

In addition, in a case where a plurality of grooves are formed as the uneven structure, the length of grooves which are formed by being continuously irradiated with laser in the main scanning direction is set to A, and the length of grooves which are formed by being continuously irradiated with laser in the sub-scanning direction is set to B. At this time, it is preferable that the grooves are formed under the condition that A is three times or more longer than B, or under the condition that only A is provided, that is, by performing engraving only in the main scanning direction.

(Laser Engraving)

As the method for laser engraving, for example, a method in which a sheet-like printing plate precursor for laser engraving is twined around the outer peripheral surface of a drum having a cylindrical shape, the drum is rotated, an exposure head is caused to perform scanning on the printing plate precursor in a sub-scanning direction orthogonal to a main scanning direction at a predetermined pitch by emitting laser light according to the output image data from the exposure head to the printing plate precursor such that a two-dimensional image is engraved (recorded) on the surface of the printing plate precursor at a high speed, and the like can be used.

The kind of laser used in the laser engraving is not particularly limited but infrared laser is preferably used. In a case where irradiation is performed with infrared laser, the molecules in the crosslinked relief forming layer are vibrated to generate heat. In a case where high output laser such as carbon dioxide gas laser or yttrium aluminum garnet (YAG) laser is used as infrared laser, a large amount of heat is generated in the laser irradiation portion, the molecules in the cured layer are cut or ionized, and thereby, selective removal, that is, engraving is implemented.

From the viewpoint of productivity, costs and the like, as infrared laser, carbon dioxide gas laser ($CO_2$ laser) or semiconductor laser is preferable, and semiconductor infrared laser with fiber (FC-LD) is particularly preferable. Generally, semiconductor laser has a higher efficiency of laser oscillation, and is inexpensive as compared with $CO_2$ laser, and can be miniaturized. In addition, since the semiconductor laser is small, it may be easily arrayed. Further, the shape of a beam can be easily controlled by treatment of the fiber.

With regard to the semiconductor laser, one having a wavelength of 700 to 1,300 nm is preferable, one having a wavelength of 800 to 1,200 nm is more preferable, one having a wavelength of 860 to 1,200 nm is even more preferable, and one having a wavelength of 900 to 1,100 nm is particularly preferable.

In addition, the semiconductor laser with fiber can output laser light efficiently by being equipped with optical fiber, and thus this is effective in the laser engraving. Further, the shape of the beam can be controlled by treatment of the fiber. For example, the beam profile may be a top hat shape, and energy can be applied stably to the plate surface. The details of semiconductor lasers are described in "Laser Handbook 2nd Edition" edited by The Laser Society of Japan, "Applied Laser Technology" edited by The Institute of Electronics and Communication Engineers of Japan, etc.

Moreover, plate producing apparatuses including semiconductor laser constituted of fiber described in detail in JP2009-172658A and JP2009-214334A can be suitably used for the method for manufacture a flexographic printing plate of the present invention.

[Rinsing Step]

The first printing plate manufacturing method of the present invention may include a rinsing step of rinsing the engraved surface with an aqueous alkali solution, after the engraving step. By providing the rinsing step, the engraving residue adhering to and remaining on the engraved surface can be removed by washing away.

Examples of the means for rinsing include a method of immersing the printing plate in an aqueous alkali solution; a method of rotating the rinsing liquid or rubbing the engraved surface with a brush, while immersing the printing plate in an aqueous alkali solution; a method of spraying an aqueous alkali solution; and a method of rubbing the engraved surface with a brush mainly in the presence of an aqueous alkali solution, using a batch type or conveyor type brush washing machine which is known as a developing machine for photosensitive resin relief printing plates. In the case in which the slime of the engraving residue cannot be removed, a rinsing liquid containing soap or a surfactant may be used.

[Drying Step]

In the first printing plate manufacturing method of the present invention, in the case of performing the rinsing step of rinsing the engraved surface, after the engraving step, a drying step of volatilizing the rinsing liquid by drying the engraved relief forming layer may be added.

[Post-Crosslinking Step]

In the first printing plate manufacturing method of the present invention, as required, after the engraving step, a post-crosslinking step of further crosslinking the relief layer may be added. By carrying out a post-crosslinking step, which is an additional crosslinking step, it is possible to further strengthen the relief formed by engraving.

Herein, in the first printing plate manufacturing method described above, the configuration in which uneven structure is directly formed by laser engraving (direct laser engraving (DLE) method) is adopted but there is no limitation thereto. Various known manufacturing methods such as a laser ablation masking system (LAMS) method in which an image is written on the surface of a printing plate precursor by using laser and is developed can be used.

In the LAMS manufacturing method (second printing plate manufacturing method), for example, using a laminate in which a relief forming layer and an infrared ablation layer are laminated on a support in this order, the infrared ablation layer is irradiated with infrared laser and a portion of the infrared ablation layer which is irradiated with infrared laser is removed to form a mask having a desired shape (mask forming step).

Next, ultraviolet irradiation is performed through the produced mask to cure the relief forming layer (exposure step). Next, a portion which is not cured in the exposure step, that is, a non-image area and an unexposed portion which becomes a recessed portion are removed (developing step) to form a relief layer, thereby producing a flexographic printing plate.

After the developing step, a "drying step", a "post-crosslinking step", or the like may be performed.

In a case where the printing plate is manufactured by the LAMS manufacturing method, as the resin composition for the relief layer, a resin composition known in the related art and used for forming the relief forming layer of the flexographic printing plate precursor can be used.

For example, photosensitive resin compositions including the binder polymers, the photopolymerizable polymers, and the photopolymerization initiator as described previously can be used.

In addition, as the material for forming the ablation layer, compositions known in the related art can be used.

For example, nitrocellulose, ethyl cellulose, polyacrylic acids and metal salts thereof, homopolymers and copolymers of acrylate, methacrylate, and styrene, homopolymers and copolymers of butadiene and isoprene, block copolymers of styrene and olefin, polyvinyl alcohol, polyvinyl chloride, polyacrylonitrile, and binder polymers as described previously can be used.

[Method for Manufacturing Flexographic Printing Plate Precursor]

The method for manufacturing a flexographic printing plate precursor of the present invention (hereinafter, also abbreviated as "precursor manufacturing method") is a method for manufacturing the above-described flexographic printing plate precursor according to the present invention, and the method includes a layer forming step of forming an uncrosslinked relief forming layer by using a resin composition for laser engraving, a crosslinking step of crosslinking the uncrosslinked relief forming layer to form a crosslinked relief forming layer, and an unevenness forming step of, after the crosslinking step, forming an uneven structure on a surface of the crosslinked relief forming layer by transfer to obtain a flexographic printing plate precursor.

Since the layer forming step and the crosslinking step in the method for manufacturing the flexographic printing plate precursor are the same as the layer forming step and the crosslinking step in the first printing plate manufacturing method, only the unevenness forming step is described in detail below.

[Unevenness Forming Step]

The unevenness forming step is a step of forming an uneven structure on the crosslinked relief forming layer crosslinked in the crosslinking step by transfer.

Specifically, an uneven structure can be formed by pressing a mold having a shape corresponding to an uneven structure to be formed to the crosslinked relief forming layer immediately after the crosslinking and transferring the uneven structure on the surface of the crosslinked relief forming layer.

Alternatively, the uneven structure may be formed by subjecting the crosslinked relief forming layer immediately after the crosslink to a calendar treatment by a cooling roll in which the shape corresponding to an uneven structure to be formed is applied to the surface thereof and transferring the uneven structure while cooling the crosslinked relief forming layer.

The average length RSm of roughness curve elements, the oil-retention volume A2, and the load length ratio Rmr 30% can be appropriately set by forming a desired uneven structure by changing the mold, the shape of the surface of the cooling roll, and the pressing force.

[Method for Manufacturing Flexographic Printing Plate (Third Aspect)]

A method for manufacturing a flexographic printing plate according to a third aspect of the present invention (hereinafter, also referred to as "third printing plate manufacturing method") is a method for manufacturing the above-described flexographic printing plate of the present invention, and the method includes performing laser engraving on the crosslinked relief forming layer of the flexographic printing plate precursor produced by the above-described method for manufacturing a precursor of the present invention to form the relief layer including the non-image area and the image area having the above-described uneven structure formed on the surface, thereby obtaining the flexographic printing plate.

Hereinafter, the laser engraving in the third printing plate manufacturing method will be described in detail.

[Laser Engraving]

The laser engraving in the third printing plate manufacturing method is a step of performing laser engraving on the crosslinked relief forming layer of the flexographic printing plate precursor produced by the above-described method for manufacturing a flexographic printing plate precursor of the present invention, that is, the crosslinked relief forming layer on which an uneven structure is already formed to engrave a portion which becomes a non-image area.

The laser engraving is not particularly limited and it is preferable to form a relief layer by performing engraving by irradiation with laser light corresponding to a desired image as in a known engraving step of the related art.

Regarding the method of laser engraving, the kind of laser to be used, and the like in the third printing plate manufacturing method, known methods of the related art can be appropriately adopted including those described in the above-described first printing plate manufacturing method.

In addition, in the third printing plate manufacturing method, as in the above-described first printing plate manufacturing method, a rinsing step, a drying step, and a post-crosslinking step may be performed after laser engraving, if required.

[Flexographic Printing Apparatus]

Next, the configuration of a flexographic printing apparatus (hereinafter, also simply referred to as "printing apparatus") using the flexographic printing plate according to the present invention will be described in detail. Basically, the flexographic printing apparatus has the same configuration as a flexographic printing apparatus of the related art except that the above flexographic printing plate is used.

Figure 5:
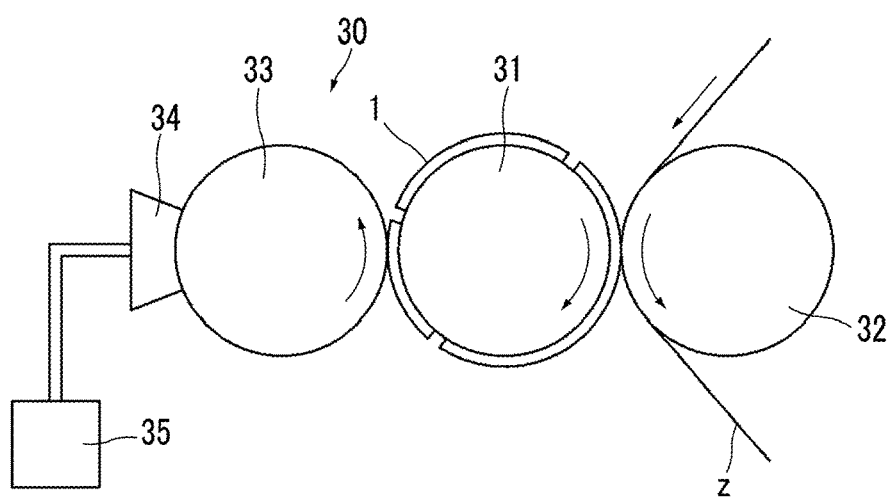
FIG. 5 is a view conceptually showing a main part of a flexographic printing apparatus using the flexographic printing plate according to the present invention.

FIG. 5 is a view conceptually showing the main part of a flexographic printing apparatus using the flexographic printing plate according to the present invention.

As shown in FIG. 5, a flexographic printing apparatus 30 has the flexographic printing plate 1, a drum (plate cylinder) 31, a transport roller (impression cylinder) 32, an anilox roller 33, a doctor chamber 34, and a circulation tank 35.

The drum 31 has a cylindrical shape, and the flexographic printing plate 1 is placed onto the peripheral surface thereof. While rotating, the drum 31 brings the flexographic printing plate 1 into contact with an object to be printed z.

The transport roller 32 is a roller constituting a transport portion (not shown in the drawing) which transports the object to be printed z along a predetermined transport path. The transport roller 32 is arranged such that the peripheral surface thereof faces the peripheral surface of the drum 31, and brings the object to be printed z into contact with the flexographic printing plate 1.

The drum 31 is arranged such that the rotation direction thereof becomes identical to the transport direction of the object to be printed z.

The anilox roller 33, the doctor chamber 34, and the circulation tank 35 are portions for supplying ink to the flexographic printing plate 1. The circulation tank 35 stores ink, and the ink in the circulation tank 35 is supplied to the doctor chamber 34 by a pump (not shown in the drawing). The doctor chamber 34 is arranged to come into close contact with the surface of the anilox roller 33 and holds ink in the inside thereof. The anilox roller 33 rotates in synchronization with the drum 31 in a state of abutting on the peripheral surface of the drum 31, such that the printing plate 1 is coated (supplied) with the ink in the doctor chamber 34.

While transporting the object to be printed z along a predetermined transport path, the flexographic printing apparatus 30 having the above configuration rotates the flexographic printing plate 1 placed onto the drum 31 and transfers the ink to the object to be printed z, thereby performing printing. That is, the rotation direction of the drum onto which the flexographic printing plate is placed becomes the printing direction.

The kind of the object to be printed used in the flexographic printing apparatus using the flexographic printing plate of the present invention is not particularly limited and various known objects to be printed used in general flexographic printing apparatuses, such as paper, films, and cardboards, can be used.

In addition, the kind of the ink used in the flexographic printing apparatus using the flexographic printing plate of the present invention is not particularly limited and various known inks used in general flexographic printing apparatuses, such as an aqueous ink, an ultra violet (UV) ink, an oil ink, and an electron beam (EB) ink, can be used.

The flexographic printing plate, the flexographic printing plate precursor, the method for manufacturing the flexographic printing plate, and the method for manufacturing the flexographic printing plate precursor of the present invention have been described above. However, the present invention is not limited to the above examples and various improvements and modifications can be of course made without departing from the spirit of the present invention.

EXAMPLES

Hereinafter, the present invention will be more specifically described based on Examples. Any materials, amount of use, ratio, details of processing, procedures of processing and the like shown in Examples below may appropriately be modified without departing from the spirit of the present invention. Therefore, it is to be understood that the scope of the present invention should not be interpreted in a limited manner based on Examples shown below.

Example 1

<Preparation of Resin Composition A>

80 parts by mass of EPDM: MITSUI EPT1045 (ethylene-propylene-diene copolymer, ethylene content: 58% by mass, diene content: 5% by mass, kind of diene: (dicyclopentadiene (DCPD), manufactured by Mitsui Chemicals, Inc.) as a polymer 1, 12 parts by mass of carbon black #45L (nitrogen adsorption specific surface area: 125 $m^2/g$, DBP absorption: 45 $cm^3$/100 g, manufactured by Mitsubishi Chemical Corporation) as a photothermal conversion agent, and 5 parts by mass of PERCUMYL D40 (dicumyl peroxide (40% by mass), manufactured by NOF CORPORATION) were kneaded to prepare a resin composition A.

<Production of Flexographic Printing Plate Precursor>

The obtained resin composition A was crosslinked by heating at a pressure of 10 MPa and 160° C. for 20 minutes using a heating press machine (MP-WCL, manufactured by Toyo Seiki Seisaku-sho, Ltd.) and thus a crosslinked relief forming layer having a thickness of 915 µm was formed.

A photocuring composition (3030, manufactured by Three Bond Co., Ltd.) was applied to one side of the obtained crosslinked relief forming layer so as to have an average film thickness of 100 µm after curing, and then a PET film having a thickness of 125 µm, as a support, was laminated by a nip roller. Then, after 20 seconds, the photocuring composition was cured by an UV exposure machine (UV exposure machine ECS-151U manufactured by Eye Graphics Co., Ltd., metal halide lamp, 1,500 mJ/$cm^2$, 14 sec exposure) from the PET film side to obtain a flexographic printing plate precursor having a thickness of 1.14 mm.

<Production of Flexographic Printing Plate>

A flexographic printing plate having an image area, a non-image area, and an uneven structure on the surface of the image area was formed by performing laser engraving on the crosslinked relief forming layer of the obtained flexographic printing plate precursor.

Specifically, engraving by irradiation with laser was performed using a laser engraving machine (1300S, manufactured by Hell Gravure Systems) under the conditions of a resolution of 2,540 dpi. Then, a cleaning agent (2% aqueous solution of JOY (registered trademark), manufactured by The Procter & Gamble Company) was dropped onto the plate and rubbed with a pig bristle brush, and the plate was washed with flowing water to remove the engraving residue.

Figure 6A:
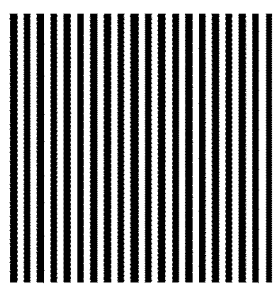
FIG. 6A is a view showing a pattern of an uneven structure used for flexographic printing plates produced in examples.
Figure 6B:
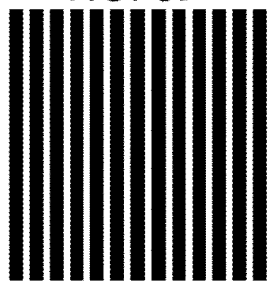
FIG. 6B is a view showing a pattern of an uneven structure used for a flexographic printing plate produced in an example.
Figure 6C:
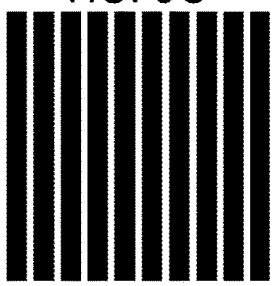
FIG. 6C is a view showing a pattern of an uneven structure used for flexographic printing plates produced in an example and a comparative example.
Figure 6D:
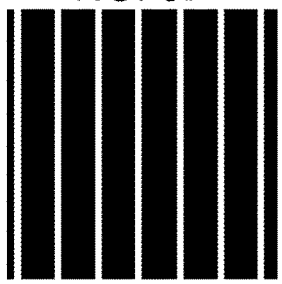
FIG. 6D is a view showing a pattern of an uneven structure used for flexographic printing plates produced in examples and a comparative example.
Figure 6E:
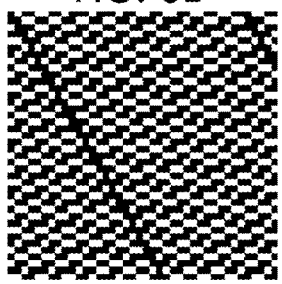
FIG. 6E is a view showing a pattern of an uneven structure used for a flexographic printing plate produced in an example.
Figure 6F:
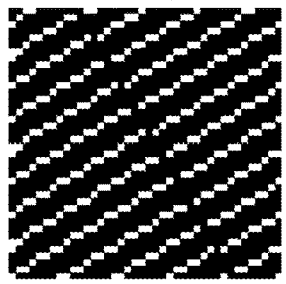
FIG. 6F is a view showing a pattern of an uneven structure used for a flexographic printing plate produced in an example.
Figure 6G:
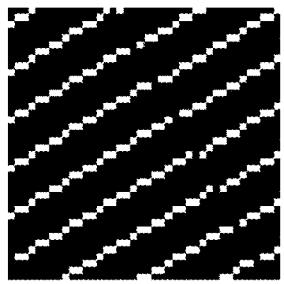
FIG. 6G is a view showing a pattern of an uneven structure used for flexographic printing plates produced in an example and a comparative example.
Figure 6H:
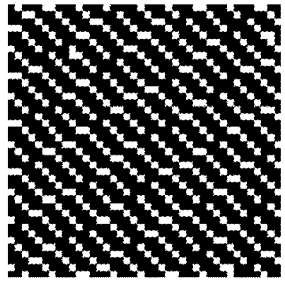
FIG. 6H is a view showing a pattern of an uneven structure used for a flexographic printing plate produced in an example.

Herein, for a pattern of the uneven structure in the image area, engraving was performed using an image pattern 1 shown in FIG. 6A (the white portion is an exposed portion and represents a recessed portion, and the black portion is an unexposed portion and represents a projecting portion) with a light quantity of Lv 10 to form an image area having a surface roughness parameter shown in Table 1 below.

In the image pattern 1, the width of the recessed line and the projecting line is one pixel (2,540 dpi) and is about 10 µm. Accordingly, in the image pattern 1, the pitch of the unevenness is two pixels.

The average length RSm of roughness curve elements, the oil-retention volume A2, and the load length ratio Rmr 30% of a roughness profile shown in Table 1 below are measured by the measurement methods described above.

In addition, the light quantity Lv shown in Table 1 below refers to a set value of 8-bit gradation of the irradiation laser power (Depth Power) of the non-image area using a laser engraving machine (1300S, manufactured by Hell Gravure Systems), and refers to a set value in a case where the irradiation laser power of the non-image area is set to 255 Lv. A light quantity of 10 Lv corresponds to 10/255 the irradiation laser power of the non-image area.

Examples 2 to 15

Flexographic printing plates were produced in the same manner as in Example 1 except that the conditions in laser engraving (light quantity and image pattern) were changed to the conditions shown in Table 1 below.

In Table 1 below, regarding the image patterns, the image patterns shown in FIGS. 6B to 6H are respectively denoted as image patterns 2 to 8.

In the image pattern 2 (FIG. 6B), the line width of the recessed line was 1 pixel (10 µm), the line width of the projecting line was 2 pixels (20 µm), and the pitch was 3 pixels.

In the image pattern 3 (FIG. 6C), the line width of the recessed line was 1 pixel (10 µm), the line width of the projecting line was 3 pixels (30 µm), and the pitch was 4 pixels.

In the image pattern 4 (FIG. 6D), the line width of the recessed line was 1 pixel (10 µm), the line width of the projecting line was 5 pixels (50 µm), and the pitch was 6 pixels.

In the image pattern 5 (FIG. 6E), the line width of the recessed line was 1 pixel (10 µm), the line width of the projecting line was 1 pixel (10 µm), and the pitch was 2 pixels, and the recessed portion was inclined at 60° in the main scanning direction.

In the image pattern 6 (FIG. 6F), the line width of the recessed line was 1 pixel (10 µm), the line width of the projecting line was 3 pixels (30 µm), and the pitch was 4 pixels, and the recessed portion was inclined at 60° in the main scanning direction.

In the image pattern 7 (FIG. 6G), the line width of the recessed line was 1 pixel (10 µm), the line width of the projecting line was 5 pixels (50 µm), and the pitch was 6 pixels, and the recessed portion was inclined at 60° in the main scanning direction.

In the image pattern 8 (FIG. 6H), the line width of the recessed line was 1 pixel (10 µm), the line width of the projecting line was 2 pixels (20 µm), and the pitch was 3 pixels, and the recessed portion was inclined at 51.2° in the main scanning direction.

Examples 16 to 18

Flexographic printing plates were produced in the same manner as in Example 1 except that the polymer 1 used in the resin composition was changed to polymers 2 to 4 shown below, respectively, the amount of carbon black was changed to 9 parts by mass, the amount of PERCUMYL D40 was changed to 0.2 parts by mass, and the heating pressing was performed at 180° C. for 10 minutes.

Polymer 2: syndiotactic 1,2-polybutadiene RB820 (manufactured by JSR Corporation)
Polymer 3: syndiotactic 1,2-polybutadiene RB830 (manufactured by JSR Corporation)

-continued

Polymer 4: syndiotactic 1,2-polybutadiene RB840 (manufactured by JSR Corporation)

Examples 19 to 21

Flexographic printing plates were produced in the same manner as in Example 1 except that the polymer 1 used in the resin composition was changed to polymers 4 to 6 shown below, respectively, the amount of carbon black was changed to 6 parts by mass, the amount of PERCUMYL D40 was not added, and the heating pressing was performed at 20 MPa for 5 minutes.

Polymer 5: α-olefin-based elastomer NOTIO TM PN-2060 (manufactured by Mitsui Chemicals America Inc.)
Polymer 6: ethylene-octene copolymer Engage TM 8200 (manufactured by Dow Chemical Company)
Polymer 7: ethylene-octene copolymer Engage TM 8401 (manufactured by Dow Chemical Company)

Example 22

<Preparation of Resin Composition B>

80 parts by mass of syndiotactic 1,2-polybutadiene RB830 (polymer 3: manufactured by JSR Corporation) as a polymer, 9 parts by mass of carbon black #45L (nitrogen adsorption specific surface area: 125 $m^2/g$, DBP absorption amount: 45 $cm^3/100$ g, manufactured by Mitsubishi Chemical Corporation) as a photothermal conversion agent, and 0.2 parts by mass of PERCUMYL D40 [dicumyl peroxide (40% by mass), manufactured by NOF CORPORATION] were kneaded to prepare a resin composition B.

<Production of Flexographic Printing Plate Precursor>

The obtained resin composition B was crosslinked by heating using a heating press machine (MP-WCL, manufactured by Toyo Seiki Seisaku-sho, Ltd.), at a pressure of 10 MPa and 180° C. for 10 minutes, and thus a relief forming layer having a thickness of 915 µm was produced. Immediately after the formation of the relief forming layer, a SUS plate in which a plurality of grooves having a width of 10 µm, a depth of 10 µm, and a pitch of 20 µm were formed on one surface thereof in parallel was stacked on the printing surface of a flexographic printing plate precursor, and the laminate was pressed at a pressure of 2 MPa and 25° C. for 30 seconds to transfer the uneven structure.

A photocuring composition (3030, manufactured by Three Bond Co., Ltd.) was applied to a surface of the obtained relief forming layer on which an uneven structure was not formed so as to have an average film thickness of 100 µm after curing, and then a PET film having a thickness of 125 µm, as a support, was laminated by a nip roller. Then, after 20 seconds, the photocuring layer was cured by an UV exposure machine (UV exposure machine ECS-151U manufactured by Eye Graphics Co., Ltd., metal halide lamp, 1,500 $mJ/cm^2$, 14 sec exposure) from the PET film side to obtain a flexographic printing plate precursor having an uneven structure on the surface thereof and a thickness of 1.14 mm.

<Production of Flexographic Printing Plate>

By performing laser engraving on the relief forming layer of the obtained flexographic printing plate precursor, a flexographic printing plate having an image area and a non-image area was produced.

Specifically, engraving by irradiation with laser was performed using a laser engraving machine (1300S, manufactured by Hell Gravure Systems) under the conditions of a resolution of 2,540 dpi. Then, a cleaning agent (2% aqueous solution of JOY (registered trademark), manufactured by The Procter & Gamble Company) was dropped onto the plate and rubbed with a pig bristle brush, and the plate was washed with flowing water to remove the engraving residue.

Herein, since the uneven structure is formed on the surface of the relief forming layer, the surface of the image area of the obtained flexographic printing plate has the uneven structure.

Example 23

<Preparation of Resin Composition C>

60 parts by mass of Kraton D-1102 (polymer 8: SBS block copolymer, manufactured by Kraton Polymers) as a polymer, 32 parts by mass of DEHP #80030 (bis(2-ethylhexyl) phthalate, manufactured by Sigma Aldrich) as a plasticizer, 10 parts by mass of A-HD-N (hexanediol diacrylate, manufactured by Shin-Nakamura chemical Co., Ltd.) as a monomer, 2 parts by mass of IRGACURE 651 (manufactured by BASF SE) as a photopolymerization initiator, and 1 part by mass of a dye and a thermal stabilizer were kneaded to prepare a resin composition C.

<Production of Flexographic Printing Plate Precursor>

100 parts by mass of carbon black and 3 parts by mass of a plasticizer were added to a binder polymer formed of 75 parts by mass of acrylic resin and 25 parts by mass of nitrile rubber (NBR), and 815 parts by mass of methyl isobutyl ketone was further added thereto as a solvent, thereby mixing the materials with a stirrer. The obtained liquid mixture was dispersed by a roll mill and then methyl isobutyl ketone was further added thereto, thereby preparing an infrared ablation composition.

The obtained infrared ablation composition was applied to a substrate in which a pressure sensitive adhesion preventing agent was applied to one surface of a PET film having a thickness of 100 µm as a cover film in advance with a bar coater so as to have a thickness of 3 µm after drying and thus an infrared ablation layer was formed.

The resin composition C prepared in advance was applied to a substrate in which an adhesive was applied to one surface of a PET film having a thickness of 125 µm in advance as a support, then the cover film was laminated on the layer side of the resin composition C to face the infrared ablation layer, and the laminate was pressed with a press machine heated at 120° C. so as to have a thickness of 1.14 mm excluding the cover film. Thus, a flexographic printing plate precursor was obtained.

<Production of Flexographic Printing Plate>

The obtained flexographic printing plate precursor was irradiated with actinic rays (light source: Philips ultraviolet low-pressure mercury lamp, illuminance: 32 $mW/cm^2$ at 365 nm) for 15 seconds from the support side to form a foundation of a relief layer. Thereafter, the cover film was peeled off.

Figure 7:
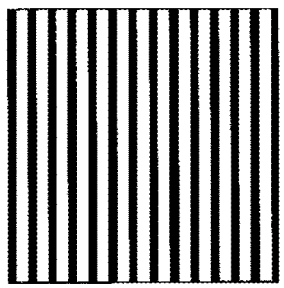
FIG. 7 is a view showing a pattern of an uneven structure used for a flexographic printing plate produced in an example.

The flexographic printing plate precursor from which the cover film was peeled off was wound around Esko CDI SPARK4835, and imaging was performed at a resolution of 4,000 dpi. At this time, the infrared ablation layer was irradiated with infrared laser so that the uneven structure of the surface of the image area became a mask pattern shown in FIG. 7 (the white portion is an exposed portion and represents a projecting portion, and the black portion is an unexposed portion and represents a recessed portion), thereby forming a mask (mask forming step).

After the mask was formed, the flexographic printing plate precursor was taken out, returned to a plane surface, and irradiated with actinic rays (light source: Philips ultraviolet low-pressure mercury lamp, illuminance: 32 mW/cm$^2$ at 365 nm) for 420 seconds (exposure step).

After the exposure step, methyl ethyl ketone (MEK, manufactured by Idemitsu Kosan Co., Ltd.) was dropped onto the flexographic printing plate precursor and rubbed with a pig bristle brush, and the plate precursor was washed with flowing water to perform development (developing step). After the development, the plate precursor was dried at 60° C. for 10 minutes, irradiated with actinic rays (light source: Philips ultraviolet low-pressure mercury lamp, illuminance: 32 mW/cm$^2$ at 365 nm) for 600 seconds, and finally irradiated with a germicidal lamp for 300 seconds to remove surface tackiness (detacking) to obtain a flexographic printing plate.

In the formed uneven structure, the line width of the recessed line was 10 μm, the line width of the projecting line was 20 μm, and pitch was 30 μm.

Example 24

<Preparation of Resin Composition D>

10 parts by mass of polytetramethylene glycol (PTMG850, manufactured by Mitsubishi Chemical Corporation), 20 parts by mass of dimethylolpropionic acid (manufactured by Tokyo Chemical Industry Co., Ltd.), 40 parts by mass of hexamethylene diisocyanate (manufactured by Tokyo Chemical Industry Co., Ltd.), and 1.7 parts by mass of n-dibutyltin dilaurate (manufactured by Tokyo Chemical Industry Co., Ltd.) were dissolved in 100 parts by mass of tetrahydrofuran and stirred at 65° C. for 3 hours. 9 parts by mass of hydroxyethyl methacrylate (manufactured by Kyoeisha Chemical Co., Ltd.) was further added thereof and stirred at 65° C. for 2 hours. A solution adjusted by dissolving terminal amino group-containing acrylonitrile and 63 parts by mass of butadiene oligomer (Hycar ATBNX 1300×16, manufactured by Ube Industries, Ltd.) in 100 parts by mass of tetrahydrofuran was added to the above solution while stirring under room temperature, and the obtained solution was dried under reduced pressure to remove tetrahydrofuran. Thus, a hydrophilic polymer was obtained.

30 parts by mass of the synthesized hydrophilic polymer, 25 parts by weight of a styrene-butadiene-styrene block copolymer (KRATON 1102, manufactured by Shell Japan Ltd.), 30 parts by mass of liquid polybutadiene (LIR305, manufactured by KURARAY CO., LTD.), 2.5 parts by mass of 1,6-hexanediol dimethacrylate (manufactured by Kyoeisha Chemical Co., Ltd.), 8 parts by weight of 1,6-nonanediol diacrylate (manufactured by Shin-Nakamura chemical Co., Ltd.), 2 parts by mass of 2-phenyl-2,2-dimethoxy acetophenone (manufactured by Tokyo Kasei Kogyo Co., Ltd.), and 0.3 parts by mass of 2,6-di-t-butyl-p-cresol (manufactured by Tokyo Kasei Kogyo Co., Ltd.) were kneaded at 130° C. to prepare a resin composition D.

Example 24

<Production of Flexographic Printing Plate Precursor>

100 parts by mass of carbon black and 3 parts by mass of a plasticizer were added to a binder polymer formed of 75 parts by mass of acrylic resin and 25 parts by mass of nitrile rubber (NBR), and 815 parts by mass of methyl isobutyl ketone was further added thereto as a solvent, thereby mixing the materials with a stirrer. The obtained liquid mixture was dispersed by a roll mill and then methyl isobutyl ketone was further added thereto, thereby preparing an infrared ablation composition.

The obtained infrared ablation composition was applied to a substrate in which a pressure sensitive adhesion preventing agent was applied to one surface of a PET film having a thickness of 100 μm as a cover film in advance with a bar coater so as to have a thickness of 3 μm after drying and thus an infrared ablation layer was formed.

The resin composition D prepared in advance was applied to a substrate in which an adhesive was applied to one surface of a PET film having a thickness of 125 μm in advance as a support, then the cover film was laminated on the layer side of the resin composition D to face the infrared ablation layer, and the laminate was pressed with a press machine heated at 120° C. so as to have a thickness of 1.14 mm excluding the cover film. Thus, a flexographic printing plate precursor was obtained.

<Production of Flexographic Printing Plate>

The obtained flexographic printing plate precursor was irradiated with actinic rays (light source: Philips ultraviolet low-pressure mercury lamp, illuminance: 32 mW/cm$^2$ at 365 nm) for 15 seconds from the support side. Thereafter, the cover film was peeled off.

The flexographic printing plate precursor from which the cover film was peeled off was wound around Esko CDI SPARK4835, and imaging was performed at a resolution of 4,000 dpi. At this time, the infrared ablation layer was irradiated with infrared laser so that the uneven structure of the surface of the image area became a mask pattern shown in FIG. 7 (the white portion is an exposed portion and represents a projecting portion, and the black portion is an unexposed portion and represents a recessed portion), thereby forming a mask (mask forming step).

After the mask was formed, the flexographic printing plate precursor was taken out, returned to a plane surface, and irradiated with actinic rays (light source: Philips ultraviolet low-pressure mercury lamp, illuminance: 32 mW/cm$^2$ at 365 nm) for 420 seconds (exposure step).

After the exposure step, development was performed with neutral water containing 5% by weight of sodium alkylnaphthalenesulfonate at 40° C. for 10 minutes (developing step). After the development, the plate precursor was dried at 60° C. for 10 minutes, irradiated with actinic rays (light source: Philips ultraviolet low-pressure mercury lamp, illuminance: 32 mW/cm$^2$ at 365 nm) for 600 seconds, and finally irradiated with a germicidal lamp for 300 seconds to remove (detack) surface tackiness to obtain a flexographic printing plate.

Comparative Example 1

Figure 8A:
FIG. 8A is a view showing a pattern of an uneven structure used for a flexographic printing plate produced in a comparative example.

A flexographic printing plate was produced in the same manner as in Example 1 except that the uneven structure was not provided on the surface of the image area (which becomes an image pattern 9 in FIG. 8A).

Comparative Examples 2 to 5

Flexographic printing plates were produced in the same manner as in Example 1 except that the conditions in the laser engraving (light quantity and image pattern) were changed to the conditions shown in Table 1 below.

Figure 8B:
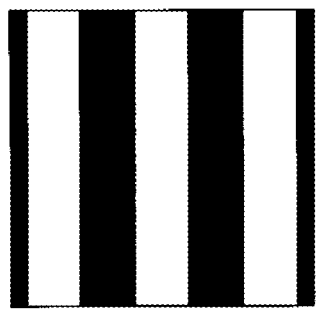
FIG. 8B is a view showing a pattern of an uneven structure used for a flexographic printing plate produced in a comparative example.

In the image pattern 10 (FIG. 8B), the line width of the recessed line was 7 pixels (70 μm), the line width of the projecting line was 7 pixels (70 μm), and the pitch was 14 pixels.

Comparative Example 6

A flexographic printing plate was produced in the same manner as in Example 22 except that immediately after crosslinking, using a SUS plate in which a plurality of grooves having a width of 5 μm, a depth of 10 μm, and a pitch of 10 μm were formed in parallel on one surface, transfer was performed.

Evaluation

The obtained flexographic printing plate was set in a printing machine (ILF-270-4F, manufactured by TAIYO KIKAI Ltd.), and printing was continuously performed at 40 m/min using an aqueous flexographic indigo (HYDRIC FCG 739, manufactured by Dainichiseika Color & Chemicals Mfg. Co., Ltd.) as an ink and Taiko OPP film FOS-AQ (manufactured by Futamura Chemical Co., Ltd.) as printing paper. Evaluation was performed based on the following standards by measuring the density of the ink in the solid portion on the printed matter 1,000 m from the start of printing at three points with a portable reflective densitometer (manufactured by X-Rite, Incorporated) twice, and calculating an average value of measurement values of a total of 6 measurements.

A: The average value of density was 1.85 or more.
B: The average value of density was less than 1.85 and 1.70 or more.
C: The average value of density was less than 1.70 and 1.55 or more.
D: The average value of density was less than 1.55 and 1.40 or more.
E: The average value of density was less than 1.40.

The evaluation grade of C or higher was evaluated as a pass.

In addition, the ink uniformity was evaluated by using a hybrid laser microscope OPTELICS (registered trademark) HYBRID (manufactured by Lasertec Corporation) as follows.

A solid print portion on a printed matter was imaged using a lens of a magnification of 5 times to obtain brightness data in 0.99 mm$^2$. Regarding the obtained brightness data, a standard deviation which is an index for variation was obtained and defined as ink uniformity.

The standard deviation of 15 or less was evaluated as a pass. As the standard deviation decreases, the variation decreases, which indicates high ink uniformity.

The results are shown in Table 1.

In the item of the forming method of the uneven structure in Table 1, a case where the uneven structure was formed directly by laser engraving is denoted as "DLE", a case where the uneven structure was formed by forming a mask and performing exposure and development is denoted as "LAMS", and a case where the uneven structure was formed by transfer after crosslinking is denoted as "transfer".

TABLE 1

|  | Kind of polymer | Forming method of uneven structure | Laser engraving condition | | Surface roughness parameter | | | Evaluation | |
| --- | --- | --- | --- | --- | --- | --- | --- | --- | --- |
|  |  |  | Image | Light quantity Lv | RSm (μm) | A2 | Rmr 30% (%) | Solid portion density | Ink uniformity |
| Example 1 | 1 | DLE | 1 | 10 | 20.4 | 58.4 | 39.2 | B | 9.4 |
| Example 2 | 1 | DLE | 2 | 10 | 29.6 | 119.6 | 68.1 | A | 7.5 |
| Example 3 | 1 | DLE | 3 | 10 | 40 | 108.2 | 65.7 | B | 10.2 |
| Example 4 | 1 | DLE | 4 | 10 | 59.3 | 146.8 | 77.3 | C | 12.2 |
| Example 5 | 1 | DLE | 1 | 5 | 20.3 | 55.5 | 46.9 | B | 9.9 |
| Example 6 | 1 | DLE | 1 | 15 | 20.6 | 75.7 | 45.2 | A | 7.4 |
| Example 7 | 1 | DLE | 1 | 20 | 31.1 | 58.8 | 59.9 | A | 10.3 |
| Example 8 | 1 | DLE | 1 | 25 | 32.1 | 34.1 | 38.7 | B | 11.1 |
| Example 9 | 1 | DLE | 1 | 30 | 33.1 | 72.8 | 56 | B | 10.3 |
| Example 10 | 1 | DLE | 4 | 5 | 59 | 49.5 | 80.7 | C | 13.7 |
| Example 11 | 1 | DLE | 5 | 10 | 35.7 | 3.8 | 25.1 | C | 12.1 |
| Example 12 | 1 | DLE | 6 | 10 | 59.7 | 101 | 77.3 | C | 13.2 |
| Example 13 | 1 | DLE | 7 | 10 | 97.6 | 86.7 | 80.7 | C | 13.3 |
| Example 14 | 1 | DLE | 5 | 5 | 27.7 | 7.9 | 29.2 | C | 12 |
| Example 15 | 1 | DLE | 8 | 10 | 36.5 | 58.7 | 48.8 | B | 10.1 |
| Example 16 | 2 | DLE | 1 | 10 | 20.3 | 60.2 | 40.7 | A | 9.4 |
| Example 17 | 3 | DLE | 1 | 10 | 20.5 | 61 | 38.5 | B | 8.5 |
| Example 18 | 4 | DLE | 1 | 10 | 20.4 | 59.5 | 41 | B | 8.6 |
| Example 19 | 5 | DLE | 1 | 10 | 20.6 | 60.6 | 40.6 | A | 10.2 |
| Example 20 | 6 | DLE | 1 | 10 | 19.8 | 58.8 | 39.9 | A | 7.9 |
| Example 21 | 7 | DLE | 1 | 10 | 20.7 | 59.3 | 39.3 | B | 9.6 |
| Example 22 | 3 | Transfer | — | — | 20.5 | 51 | 40.2 | A | 8.9 |
| Example 23 | — | LAMS | — | — | 31.3 | 120.5 | 65.5 | B | 8.7 |
| Example 24 | — | LAMS | — | — | 30.7 | 119.8 | 69.9 | B | 8.8 |
| Comparative Example 1 | 1 | — | 9 | — | 15.9 | 0.7 | 8.2 | D | 15.3 |
| Comparative Example 2 | 1 | DLE | 3 | 25 | 40 | 221.5 | 54 | E | 28.2 |
| Comparative Example 3 | 1 | DLE | 4 | 25 | 59.9 | 304.2 | 79.1 | E | 18.9 |
| Comparative Example 4 | 1 | DLE | 10 | 10 | 139.6 | 59.5 | 40.7 | D | 15.7 |
| Comparative Example 5 | 1 | DLE | 7 | 5 | 101.3 | 90.2 | 95.5 | D | 18.6 |
| Comparative Example 6 | 3 | Transfer | — | — | 9.8 | 51.1 | 39.8 | D | 15.5 |

As shown in Table 1, it is found that in Examples 1 to 24 of the flexographic printing plates of the present invention in which the average length RSm of roughness curve elements is 15 to 120 μm, the oil-retention volume A2 is 2 to 180, the load length ratio Rmr 30% at a cutting level of 30% is 20% to 90%, compared to Comparative Examples 1 to 6, ink uniformity is high and the ink density in the solid portion is high.

From the comparison of Examples 1 to 4, 10 to 12, and the like, it is found that the average length RSm of roughness curve elements is preferably 20 to 40 μm.

From the comparison of Examples 1, 8, 11, 14, and the like, it is found that the oil-retention volume A2 is preferably 40 to 140.

From the comparison of Examples 1, 4, 11, 14, and the like, it is found that that the load length ratio Rmr 30% is preferably 35% to 75%.

Therefore, the effects of the present invention are clear.

EXPLANATION OF REFERENCES

1: flexographic printing plate
2: relief layer
3: image area
4: non-image area
5: recessed portion
6: projecting portion
D: depth of recessed portion
W: width of recessed portion
30: flexographic printing apparatus
31: drum
32: transport roller
33: anilox roller
34: doctor chamber
35: circulation tank
60: calender roll
62a to 62d: first roll to fourth roll
70: kneaded product
71: uncured layer
z: object to be printed

What is claimed is:

1. A flexographic printing plate comprising:
a relief layer including a non-image area and an image area having an uneven structure formed on a surface thereof,
wherein an average length RSm of roughness curve elements of the surface of the image area having the uneven structure is 15 to 120 μm,
an oil-retention volume A2 is 2 to 180, and
a load length ratio Rmr 30% at a cutting level of 30% is 20% to 90%.

2. The flexographic printing plate according to claim 1, wherein the average length RSm of roughness curve elements is 20 to 40 μm.

3. The flexographic printing plate according to claim 1, wherein the oil-retention volume A2 is 40 to 140.

4. The flexographic printing plate according to claim 1, wherein the load length ratio Rmr 30% is 35% to 75%.

5. The flexographic printing plate according to claim 1, wherein the uneven structure includes recessed portions formed of a plurality of grooves and projecting portions other than the recessed portions.

6. The flexographic printing plate according to claim 1, wherein a material for forming the relief layer includes a crystalline polymer.

7. The flexographic printing plate according to claim 6, wherein the crystalline polymer is at least one crystalline polymer selected from the group consisting of a polybutadiene-based thermoplastic elastomer and a polyolefin-based thermoplastic elastomer.

8. A flexographic printing plate precursor comprising:
a relief forming layer having an uneven structure formed on a surface thereof,
wherein an average length RSm of roughness curve elements of the surface of the relief forming layer having the uneven structure is 15 to 120 μm,
an oil-retention volume A2 is 2 to 180, and
a load length ratio Rmr 30% at a cutting level of 30% is 20% to 90%.

9. The flexographic printing plate precursor according to claim 8, wherein the average length RSm of roughness curve elements is 20 to 40 μm.

10. The flexographic printing plate precursor according to claim 8, wherein the oil-retention volume A2 is 40 to 140.

11. The flexographic printing plate precursor according to claim 8, wherein the load length ratio Rmr 30% is 35% to 75%.

12. The flexographic printing plate precursor according to claim 8, wherein the uneven structure includes recessed portions formed of a plurality of grooves and projecting portions other than the recessed portions.

13. The flexographic printing plate precursor according to claim 8, wherein a material for forming the relief forming layer includes a crystalline polymer.

14. The flexographic printing plate precursor according to claim 13, wherein the crystalline polymer is at least one crystalline polymer selected from the group consisting of a polybutadiene-based thermoplastic elastomer and a polyolefin-based thermoplastic elastomer.

15. A method for manufacturing the flexographic printing plate according to claim 1 which has a relief layer including a non-image area and an image area having an uneven structure formed on a surface thereof, the method comprising:
a layer forming step of forming a relief forming layer by using a resin composition for laser engraving; and
an engraving step of performing laser engraving on the relief forming layer to form the relief layer including the non-image area and the image area having the uneven structure formed on the surface thereof, thereby obtaining the flexographic printing plate.

16. The method for manufacturing the flexographic printing plate according to claim 15, further comprising:
a crosslinking step of crosslinking the resin composition for laser engraving between the layer forming step and the engraving step.

17. The method for manufacturing the flexographic printing plate according to claim 15,
wherein the uneven structure is a structure including recessed portions formed of a plurality of grooves and projecting portions other than the recessed portions, and
in the engraving step, engraving is performed only in a main scanning direction to form the grooves.

18. A method for manufacturing the flexographic printing plate according to claim 1 which has a relief layer including a non-image area and an image area having an uneven structure formed on a surface thereof, the method comprising:
- a preparation step of preparing a laminate having a relief forming layer formed of a photosensitive resin composition and an ablation layer in this order;
- a mask forming step of irradiating the ablation layer with laser and removing a portion of the ablation layer which is irradiated with laser to form a mask having a desired shape;
- an exposure step of irradiating the relief forming layer with ultraviolet rays through the mask to cure the relief forming layer; and
- a developing step of removing a portion of the relief forming layer, which is not cured by the exposure step to form the relief layer, thereby obtaining the flexographic printing plate.

19. A method for manufacturing the flexographic printing plate precursor according to claim 8 which has a relief forming layer having an uneven structure formed on a surface thereof, the method comprising:
- a layer forming step of forming an uncrosslinked relief forming layer by using a resin composition for laser engraving;
- a crosslinking step of crosslinking the uncrosslinked relief forming layer to form a crosslinked relief forming layer; and
- an unevenness forming step of, after the crosslinking step, forming the uneven structure on a surface of the crosslinked relief forming layer by transfer to obtain the flexographic printing plate precursor.

20. A method for manufacturing the flexographic printing plate according to claim 1 which has a crosslinked relief layer including a non-image area and an image area having an uneven structure formed on a surface thereof, the method comprising:
- performing laser engraving on a portion, which becomes the non-image area, of the crosslinked relief forming layer of a flexographic printing plate precursor produced by the method for manufacturing the flexographic printing plate precursor according to claim 19 to produce the flexographic printing plate having the relief layer including the non-image area and the image area having the uneven structure formed on the surface thereof.

* * * * *